United States Patent
Seo et al.

(10) Patent No.: US 11,360,707 B2
(45) Date of Patent: Jun. 14, 2022

(54) MEMORY CONTROLLER FOR REPLACING BAD BLOCKS WITH RESERVED BLOCKS AND OPERATING METHOD THEREOF

(71) Applicant: SK hynix Inc., Gyeonggi-do (KR)

(72) Inventors: Dong Young Seo, Gyeonggi-do (KR); Da Young Lee, Gyeonggi-do (KR); Woo Young Yang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/875,620

(22) Filed: May 15, 2020

(65) Prior Publication Data

US 2021/0157525 A1    May 27, 2021

(30) Foreign Application Priority Data

Nov. 21, 2019   (KR) .......................... 10-2019-0150745

(51) Int. Cl.
  *G06F 3/06*   (2006.01)
  *G11C 16/04*   (2006.01)
  (Continued)

(52) U.S. Cl.
  CPC .......... *G06F 3/0659* (2013.01); *G06F 3/0604* (2013.01); *G06F 3/0679* (2013.01);
  (Continued)

(58) Field of Classification Search
  CPC ................................................... G06F 3/0604
  See application file for complete search history.

(56) References Cited

U.S. PATENT DOCUMENTS

| 2005/0257020 A1* | 11/2005 | Kashyap | ............... G06F 9/5072 711/170 |
| 2015/0052393 A1* | 2/2015 | Palmer | .................. G06F 11/108 714/15 |
| 2021/0103518 A1* | 4/2021 | Ju | .......................... G06F 9/5022 |

FOREIGN PATENT DOCUMENTS

| KR | 10-2020-0095103 A | 8/2020 |
| KR | 10-2020-0114149 A | 10/2020 |

OTHER PUBLICATIONS

Micron TN-2919, NAND Flash 101:An Introduction to NAND Flash and How to Design It in to Your Next Product, Micron, 2006 [retrieved from internet Nov. 20, 2019]{<URL:https://user.eng.umd.edu/~blj/CS-590.26/micron-tn2919.pdf>] (Year: 2006).*

* cited by examiner

*Primary Examiner* — David Yi
*Assistant Examiner* — Nicholas A. Paperno
(74) *Attorney, Agent, or Firm* — IP & T Group LLP

(57) ABSTRACT

A memory controller includes a first flash translation layer (FTL) generating a physical address corresponding to a first type logical address received from a host on the basis of information about the first memory blocks, a second FTL generating a physical address corresponding to a second type logical address received from the host on the basis of information about the second memory blocks, and a memory control unit controlling the first memory area or the second memory area to perform an operation on the physical address corresponding to the first type logical address or the physical address corresponding to the second type logical address, wherein the first FTL provides the second FTL with block request information for requesting use of the second memory blocks, and generates the physical address corresponding to the first type logical address received from the (Continued)

host on the basis of block allocation information provided by the second FTL.

19 Claims, 18 Drawing Sheets

(51) Int. Cl.
  *G06F 12/10* (2016.01)
  *G11C 16/08* (2006.01)
  *G11C 16/26* (2006.01)
(52) U.S. Cl.
  CPC .......... *G06F 12/10* (2013.01); *G11C 16/0483* (2013.01); *G11C 16/08* (2013.01); *G11C 16/26* (2013.01)

MEMORY CONTROLLER FOR REPLACING BAD BLOCKS WITH RESERVED BLOCKS AND OPERATING METHOD THEREOF

CROSS-REFERENCE TO RELATED APPLICATION

The present application claims priority under 35 U.S.C. § 119(a) to Korean patent application number 10-2019-0150745, filed on Nov. 21, 2019, which is incorporated herein by reference in its entirety.

BACKGROUND

Field of Invention

Various embodiments relate generally to an electronic device, and more particularly, to a memory controller and a method of operating the electronic device.

Description of Related Art

A storage device may store data in response to control of a host device such as a computer or a smartphone. The storage device may include a memory device storing data and a memory controller controlling the memory device. Memory devices may be divided into volatile memory devices and non-volatile memory devices.

A volatile memory device may retain data as long as power is being supplied and may lose the stored data in the absence of power supply. Types of the volatile memory devices may include Static Random Access Memory (SRAM), Dynamic Random Access Memory (DRAM), and the like.

A non-volatile memory device may not lose data even in the absence of power supply. Types of the non-volatile memory devices may include Read Only Memory (ROM), Programmable ROM (PROM), Electrically Programmable ROM (EPROM), Electrically Erasable and Programmable ROM (EEPROM) and flash memory.

SUMMARY

Various embodiments of the present disclosure are directed to a memory controller having improved reserved block management performance and a method of operating the memory controller.

According to an embodiment, a memory controller may include a first flash translation layer (FTL) configured to generate a physical address corresponding to a first type logical address received from a host on the basis of information about the first memory blocks, a second FTL configured to generate a physical address corresponding to a second type logical address received from the host on the basis of information about the second memory blocks, and a memory control unit configured to control the first memory area or the second memory area to perform an operation on the physical address corresponding to the first type logical address or the physical address corresponding to the second type logical address, wherein the first FTL provides the second FTL with block request information for requesting use of the second memory blocks, and generates the physical address corresponding to the first type logical address received from the host on the basis of block allocation information provided by the second FTL.

According to an embodiment, a memory controller may include a first FTL configured to process a request for a first type logical address received from a host, a second FTL configured to process a request for a second type logical address received from the host, a first type reserved block information storage configured to store information about first type reserved blocks to replace a bad block corresponding to the first type logical address, and a second type reserved block information storage configured to store information about second type reserved blocks to replace a bad block corresponding to the second type logical address, wherein the first FTL provides the second FTL with reserved block request information for requesting use of the second type reserved blocks based on a number of first type reserved blocks, and stores information about a target reserved block received from the second FTL in the first type reserved block information storage, and wherein the second FTL removes the information about the target reserved block from the second type reserved block information storage.

According to an embodiment, a method of operating a memory controller including a first FTL managing first reserved blocks included in a first memory device and a second FTL managing second reserved blocks included in a second memory device may include detecting, by the first FTL, a bad block occurring in the first memory device, providing, by the first FTL, the second FTL with reserved block request information for requesting the second FTL for use of the second reserved blocks included in the second memory device on the basis of a number of first reserved blocks, providing, by the second FTL, the first FTL with reserved block allocation information about a target reserved block, among the second reserved blocks, on the basis of a number of second reserved blocks, receiving, by the first FTL, information about the target reserved block from the second FTL, and replacing, by the first FTL, the bad block with the target reserved block by mapping a logical address corresponding to the bad block to a physical address of the target reserved block.

DETAILED DESCRIPTION

Specific structural and functional description is provided herein to describe embodiments of the invention. However, features and aspects of the invention may be implemented and/or carried out in various other ways. Thus, the invention is not limited to the disclosed embodiments or to any specific detail herein. Throughout the specification, reference to "an embodiment," "another embodiment" or the like is not necessarily to only one embodiment, and different references to any such phrase are not necessarily to the same embodiment(s).

Hereinafter, embodiments of the present disclosure are described in detail with reference to the accompanying drawings in order for those skilled in the art to practice the present invention.

Figure 1:
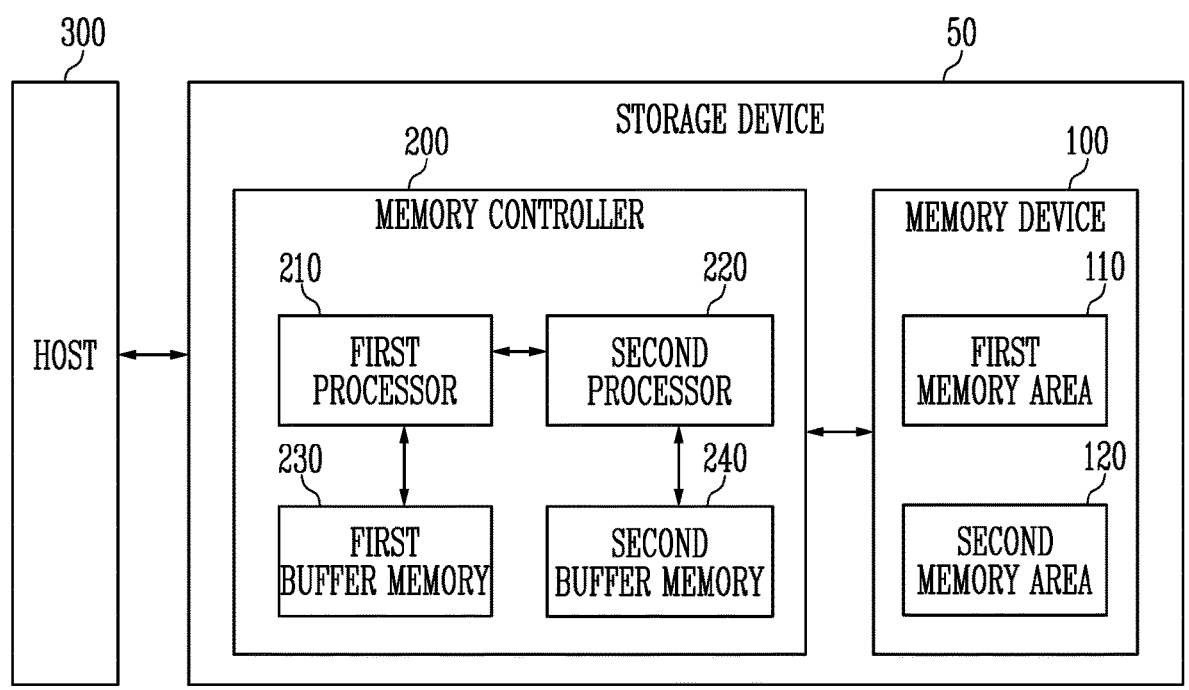
FIG. 1 is a block diagram illustrating a storage device.

FIG. 1 is a block diagram illustrating a storage device 50.

Referring to FIG. 1, the storage device 50 may include a memory device 100 and a memory controller 200 controlling operations of the memory device 100.

The storage device 50 may be configured to store data in response to control of a host 300. Examples of the storage device 50 may include a cellular phone, a smartphone, an MP3 player, a laptop computer, a desktop computer, a game player, a TV, a tablet PC, or an in-vehicle infotainment system.

The storage device 50 may be configured as any of various types of storage devices according to a host interface corresponding to a communication method with the host 300. For example, the storage device 50 may be configured as a solid state drive (SSD), a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, and/or a memory stick.

The storage device 50 may be manufactured as any of various types of packages. For example, the storage device 50 may be manufactured as a package-on-package (POP), a system-in-package (SIP), a system-on-chip (SOC), a multi-chip package (MCP), a chip-on-board (COB), a wafer-level fabricated package (WFP), and/or a wafer-level stack package (WSP).

The memory device 100 may store data. The memory device 100 may operate in response to control of the memory controller 200. According to an embodiment, the memory device 100 may include a first memory area 110 and a second memory area 120. Each of the first memory area 110 and the second memory area 120 may include a plurality of memory dies. Each of the memory dies may include a memory cell array including a plurality of memory cells storing data.

Each of the memory cells may be a single level cell (SLC) storing one data bit, a multi-level cell (MLC) storing two data bits, a triple level cell (TLC) storing three data bits, or a quad level cell (QLC) storing four data bits.

The memory cell array may include a plurality of memory blocks. Each of the memory blocks may include a plurality of memory cells. A single memory block may include a plurality of pages. According to an embodiment, a page may be a unit for storing data in the memory device 100 or a unit for reading data stored in the memory device 100. The memory block may be a unit for erasing data.

According to an embodiment, the first memory area 110 may operate in response to control of a first processor 210. Under the control of the first processor 210, a reserved block included in the first memory area 110 may be replaced with a bad block included in the first memory area 110. When the number of reserved blocks included in the first memory area 110 is less than or equal to a reference number, a reserved block included in the second memory area 120 may be replaced with the bad block included in the first memory area 110.

According to an embodiment, the second memory area 120 may operate in response to control of a second processor 220. Under the control of the second processor 220, the reserved block included in the second memory area 120 may be replaced with a bad block included in the second memory area 120. When the number of reserved blocks included in the second memory area 120 is less than or equal to a reference number, the reserved block included in the first memory area 110 may be replaced with the bad block included in the second memory area 120.

According to an embodiment, examples of the memory device 100 include a Double Data Rate Synchronous Dynamic Random Access Memory (DDR SDRAM), a Low Power Double Data Rate4 (LPDDR4) SDRAM, a Graphics Double Data Rate (GDDR) SDRAM, a Low Power DDR (LPDDR) SDRAM, a Rambus Dynamic Random Access Memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), or a spin transfer torque random access memory (STT-RAM). In the context of the description herein, it is assumed that the memory device 100 is a NAND flash memory.

The memory device 100 may receive a command and an address from the memory controller 200. The memory device 100 may be configured to access a selected area in the memory cell array in response to the received address. When the memory device 100 accesses the selected area, it may mean that the memory device 100 may perform an operation corresponding to the command on the area selected by the address. For example, the memory device 100 may perform a write operation (program operation), a read operation, and an erase operation. During a program operation, the memory device 100 may program data into the area selected in response to the address. During a read operation, the memory device 100 may read data from the area selected by the address. During an erase operation, the memory device 100 may erase data stored in the area selected by the address.

The memory controller 200 may include the first processor 210, the second processor 220, a first buffer memory 230 and a second buffer memory 240.

The first processor 210 may receive data and a logical address LA from the host 300 and convert the logical address LA into a physical address PA indicating an address of memory cells where the data of the first memory area 110 is stored. The logical address LA may be a logical block address LBA and the physical address PA may be a physical block address PBA. The first processor 210 may receive an odd logical address (odd LA) from the host 300. When the number of reserved blocks included in the first memory area 110 is less than or equal to the reference number, the first processor 210 may convert the logical address LA into the physical address PA which indicates an address of memory cells included in the second memory area 120. The first processor 210 may convert the logical address LA into the physical address PA with reference to first map information (not shown) stored in the first buffer memory 230.

The second processor 220 may receive data and the logical address LA from the host 300 and convert the logical address LA into the physical address PA indicating the address of memory cells where the data of the second memory area 120 is stored. The logical address LA may be the logical block address LBA and the physical address PA may be the physical block address PBA. The second processor 220 may receive the odd logical address from the host 300. When the number of reserved blocks included in the second memory area is less than a reference number, the second processor 220 may convert the logical address LA into the physical address PA indicating the address of memory cells included in the first memory area 110. The second processor 220 may convert the logical address LA into the physical address PA with reference to second map information (not shown) stored in the second buffer memory 240.

When a bad block occurs among the memory blocks included in the first memory area 110, the first processor 210 may replace the bad block with a reserved block included in the first memory area 110. More specifically, the first processor 210 may update the first map information (not shown) stored in the first buffer memory 230 so that a logical address corresponding to a physical address of the bad block may correspond to a physical address of the reserved block.

A bad block may be determined based on status information. The status information may be a program/erase (P/E) count, an erase/write (E/W) count, an erase count, a program count, or a read count. For example, when an erase count of a normal block is greater than or equal to a reference count, the normal block may be determined as a bad block.

A bad block may be determined based on operation failure information. The operation failure information may indicate that a program operation, a read operation or an erase operation has not been properly performed. The operation failure information may be determined based on error bit information, and pass/fail information based on a verify operation. For example, during a read operation on a normal block, the normal block may be determined as a bad block when the number of error bits exceeds a reference bit number.

According to an embodiment, the first processor 210 may request the second processor 220 for a reserved block when the number of reserved blocks included in the first memory area 110 is less than a reference number. The second processor 220 may determine whether the number of reserved blocks included in the second memory area 120 is greater than the reference number, and may allocate a reserved block to the first processor 210. The first processor 210 may update first map information (not shown) stored in the first buffer memory 230 so that the logical address corresponding to the physical address of the bad block may correspond to the physical address of the reserved block allocated by the second processor 220.

The description has been made on the basis of the first processor 210. However, the second processor 220 may update second map information (not shown) in the same manner.

The reference number may be determined by taking the lifespan of the memory device 100 into account. When the number of reserved blocks included in one of the first memory area 110 and the second memory area 120 is less than or equal to a threshold value, the entire memory device 100 may reach End of Life. For example, when the number of reserved blocks included in the first memory area 110 is less than or equal to the threshold value, the second memory area 120 as well as the first memory area 110 may reach End of Life. Therefore, even when the number of reserved blocks included in the second memory area 120 is greater than the threshold value, the second memory area 120 may become unavailable due to the first memory area 110.

The threshold value may be a basis on which the memory device 100 is switched to a read only mode. For example, when the number of reserved blocks included in one of the first memory area 110 and the second memory area 120 is less than or equal to the threshold value, the entire memory device 100 may enter the read only mode. Therefore, even when the number of reserved blocks included in the second memory area 120 is greater than the threshold value, it may be impossible to program data into the second memory area 120 due to the first memory area 110.

The reference number may be set to be greater than the threshold value serving as a basis on which the first memory area 110 or the second memory area 120 reaches End of Life, or is switched to the read only mode. The reference number may be dynamically changed in accordance with environment information. The environment information may include at least one of information about the number of memory blocks necessary for operations, information about the number of reserved blocks, information about the number of bad blocks, information about time consumed to replace a bad block, and information about time taken to be allocated with a reserved block.

According to an embodiment of the present disclosure, when the number of reserved blocks included in the first memory area 110 is less than or equal to the reference number, a bad block occurring in the first memory area 110 may be replaced with the reserved block included in the second memory area 120, so that the lifespan of the entire memory device 100 may be extended.

As described above, the bad block occurring in the first memory area 110 may be replaced by the first processor 210. However, in the same manner, a bad block occurring in the second memory area 120 may be replaced by the second processor 220.

The host 300 may communicate with the storage device 50 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and/or Load Reduced DIMM (LRDIMM) communication methods.

Figure 2:
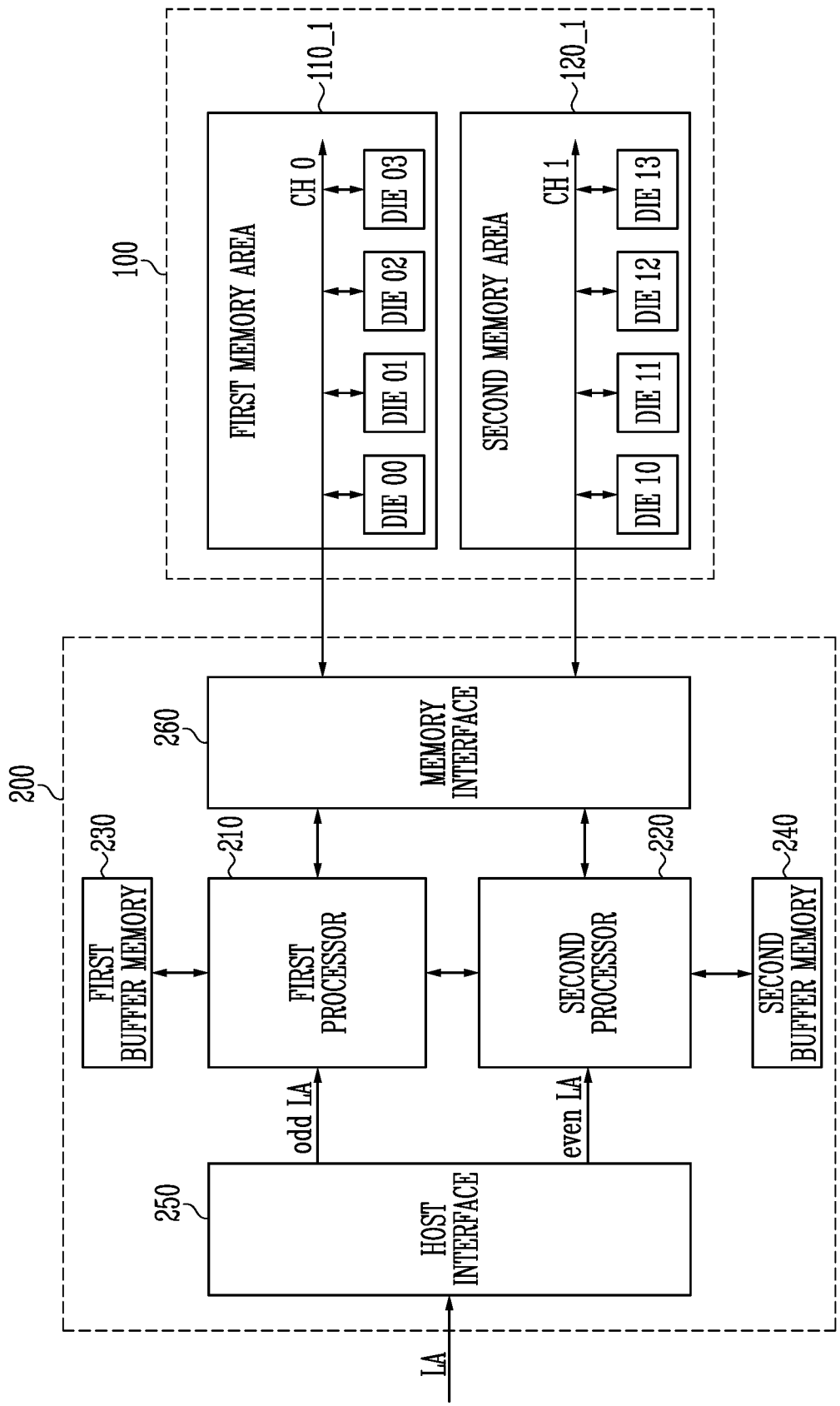
FIG. 2 is a block diagram illustrating a memory controller and a memory device according to an embodiment of the present disclosure.

FIG. 2 is a block diagram illustrating the memory controller 200 and the memory device 100 according to an embodiment of the present disclosure.

Referring to FIG. 2, the memory controller 200 may include a host interface 250, the first processor 210, the second processor 220, the first buffer memory 230, the second buffer memory 240 and a memory interface 260.

The host interface 250 may transfer the logical address LA received from the host 300 to the first processor 210 and the second processor 220 according to a rule or protocol that may be set in advance. For example, the host interface 250 may transfer the odd logical address indicating an odd number, among logical addresses received from the host 300, to the first processor 210. The host interface 250 may transfer an even logical address (even LA) indicating an even number, among the logical addresses received from the host 300, to the second processor 220.

The first processor 210 may convert the logical address LA received from the host interface 250 into the physical address PA with reference to the first map information (not shown) stored in the first buffer memory 230. The second processor 220 may convert the logical address LA received from the host interface 250 into the physical address PA with reference to the second map information (not shown) stored in the second buffer memory 240. The first processor 210 and the second processor 220 may transfer these physical addresses PA to the memory interface 260. The first processor 210 and the second processor 220 may receive a command and data from the host interface 250 and transfer the command and the data to the memory interface 260.

The memory interface 260 may transfer a physical address, the command, or the data received from the first processor 210 or the second processor 220 to the memory device 100. More specifically, when the received physical address is related to a first memory area 110_1, the memory interface 260 may transfer the command, the physical address and the data to the first memory area 110_1. When the received physical address is related to a second memory area 120_1, the memory interface 260 may transfer the command, the physical address and the data to the second memory area 120_1.

The memory device 100 may include the first memory area 110_1 and the second memory area 120_1. The first memory area 110_1 and the second memory area 120_1 may be coupled to the memory interface 260 through different channels. For example, the first memory area 110_1 may be coupled to the memory interface 260 through a channel 0 (CH 0). For example, the second memory area 120_1 may be coupled to the memory interface 260 through a channel 1 (CH 1).

Each of the first memory area 110_1 and the second memory area 120_1 may include a plurality of memory dies. The plurality of memory dies (DIE 00 to DIE 03) included in the first memory area 110_1 may be coupled to CH 0 through different ways (not shown). A plurality of memory dies (DIE 10 to DIE 13) included in the second memory area 120_1 may be coupled to CH 1 by different ways (not shown).

The number of memory dies included in each of the first memory area 110_1 and the second memory area 120_1 is not be limited to 4; each such memory area may include any suitable number of memory dies.

Figure 3:
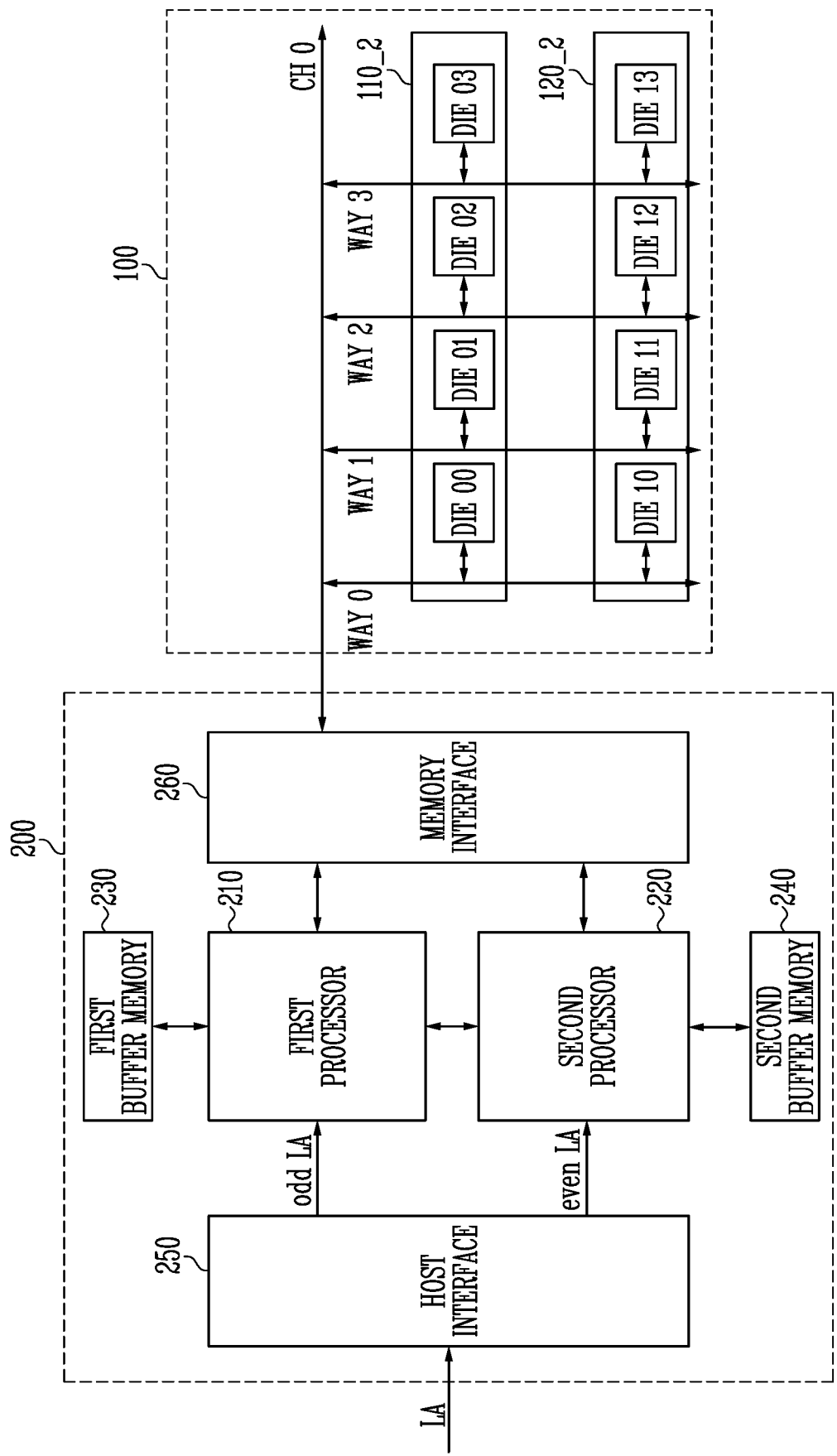
FIG. 3 is a block diagram illustrating a memory device according to another embodiment.

FIG. 3 is a block diagram illustrating a memory device according to another embodiment.

Referring to FIG. 3, the memory device 100 may include a first memory area 110_2 and a second memory area 120_2. Each of the first memory area 110_2 and the second memory area 120_2 may include a plurality of memory dies.

Unlike the first memory area 110_1 and the second memory area 120_1 of FIG. 2, the first memory area 110_2 and the second memory area 120_2 of FIG. 3 may be coupled to the memory interface 260 through the same channel. For example, the memory interface 260 may be coupled to the first memory area 110_2 and the second memory area 120_2 through CH 0.

A plurality of memory dies included in the first memory area 110_2 and a plurality of memory dies included in the second memory area 120_2 may be coupled through a plurality of ways WAY 0 to WAY 3. In the illustrated arrangement, memory area 110_2 includes 4 memory dies: DIE 00, DIE 01, DIE 02 and DIE 03; similarly memory area 120_2 includes 4 memory dies: DIE 10, DIE 11, DIE 12 and DIE 13. For example, DIE 00 of the first memory area 110_2 and DIE 10 of the second memory area 120_2 may be commonly coupled through the way 0 (WAY 0). DIE 01 of the first memory area 110_2 and DIE 11 of the second memory area 120_2 may be commonly coupled through the way 1 (WAY 1). DIE 02 of the first memory area 110_2 and DIE 12 of the second memory area 120_2 may be commonly coupled through the way 2 (WAY 2). DIE 03 of the first memory area 110_2 and DIE 13 of the second memory area 120_2 may be commonly coupled through a way 3 (WAY 3).

The memory dies included in the first memory area 110_2 may perform an interleaving operation through CH 0. The memory dies included in the second memory area 120_2 may perform an interleaving operation through CH 0. The memory dies coupled to different ways may perform an interleaving operation through CH 0. In other words, in the arrangement shown in FIG. 3, any memory dies may perform an interleaving operation through CH 0.

Therefore, when a bad block and a reserved block are replaced between the memory die of the first memory area 110_2 and the memory die of the second memory area 120_2 coupled in common to the same way, interleaving performance may be maintained.

Figure 4:
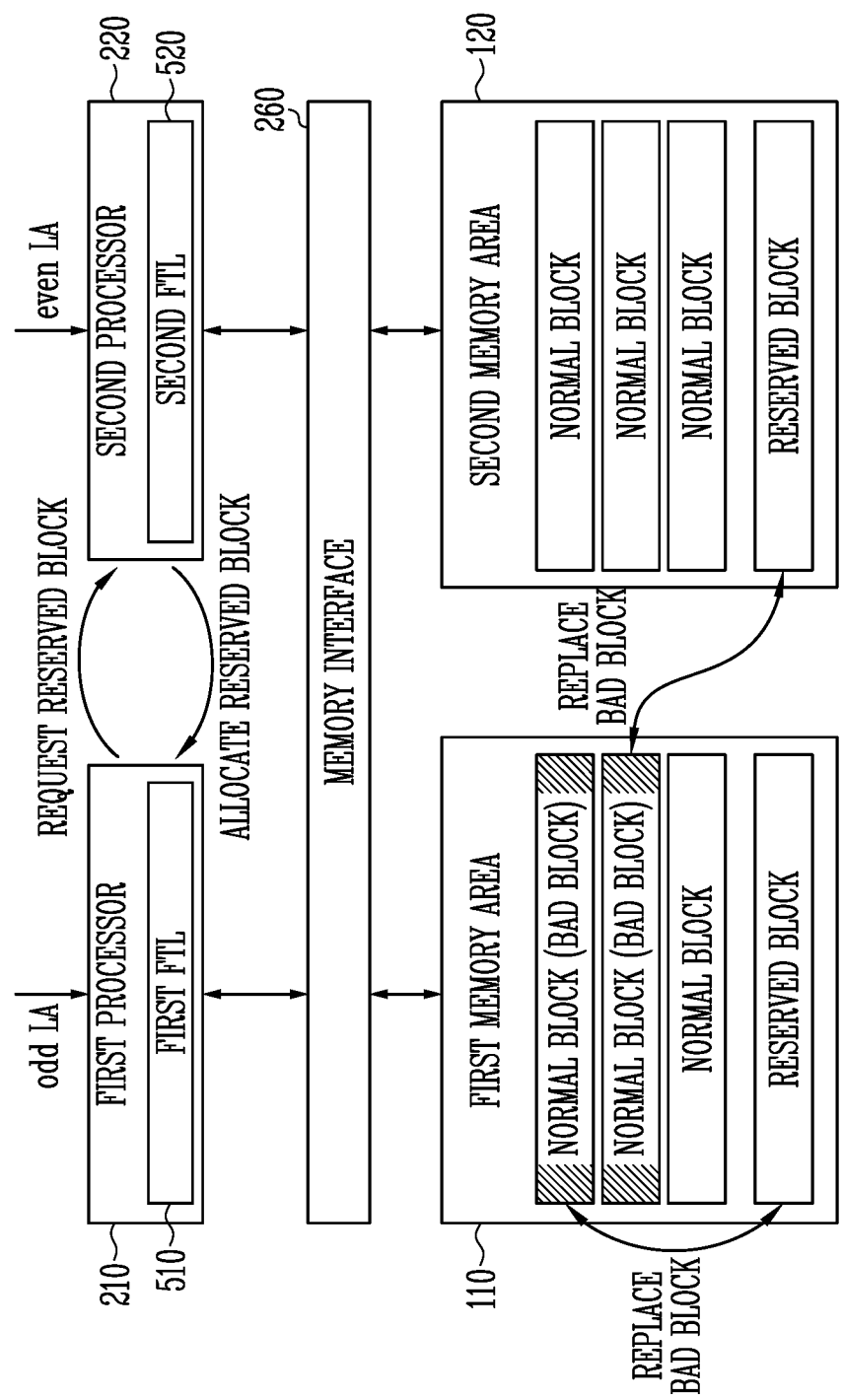
FIG. 4 is a diagram illustrating a bad block replacement process according to an embodiment of the present disclosure.

FIG. 4 is a diagram illustrating a bad block replacement process according to an embodiment of the present disclosure.

Referring to FIG. 4, each of the first memory area 110 and the second memory area 120 may include a normal block and a reserved block. A normal block may store data received from the host 300 and may be included in a system area. A normal block may be a memory block which is not a bad block. A reserved block may be replaced with a normal block determined as a bad block. Although, for convenience of explanation, a normal block and a reserved block are considered different, a reserved block may be a normal block at least until it is determined as a bad block.

A first flash translation layer (FTL) 510 and a second FTL 520 may be firmware operating for replacement of a bad block. The first FTL 510 and the second FTL 520 may be firmware driven by the first processor 210 and the second processor 220, respectively.

When the number of reserved blocks included in the first memory area 110 is greater than a reference number, the first FTL 510 may replace a bad block occurring in the first memory area 110 with a reserved block included in the first memory area 110. More specifically, the first processor 210 may update the first map information (not shown) stored in the first buffer memory 230 so that a logical address corresponding to a physical address of the bad block may correspond to a physical address of the reserved block included in the first memory area 110.

When the number of reserved blocks included in the first memory area 110 is less than or equal to the reference number, the first FTL 510 may request the second FTL 520 for a reserved block. In response to the request of the first processor 210, the second processor 220 may allocate a reserved block to the first processor 210 when the number of reserved blocks included in the second memory area 120 is greater than a reference number.

The first FTL 510 may replace the bad block occurring in the first memory area 110 by using the reserved block allocated by the second FTL 520. More specifically, the first FTL 510 may update the second map information (not shown) stored in the first buffer memory 230 so that the logical address corresponding to the physical address of the bad block may correspond to the physical address of the reserved block included in the second memory area 120.

The memory interface 260 may receive the command, the physical address and the data from the first processor 210 or the second processor 220 and may control the first memory area 110 or the second memory area 120.

When the number of reserved blocks included in either the first memory area 110 or the second memory area 120 is less than or equal to a threshold value, the entire memory device 100 may be considered to have reached End of Life. Therefore, even when the number of reserved blocks included in only one of the first or second memory areas 110, 120 is greater than the threshold value, the other memory area may become unavailable due to the one memory area having less reserved blocks than threshold.

The reference number may be set to be greater than the threshold value serving as a basis on which the first memory area 110 or the second memory area 120 reaches End of Life. According to an embodiment of the present disclosure, when the number of reserved blocks included in the first memory area 110 is less than or equal to the reference number, the bad block occurring in the first memory area 110 may be replaced with the reserved block included in the second memory area 120, so that the lifespan of the entire memory device 100 may be extended.

Figure 5:
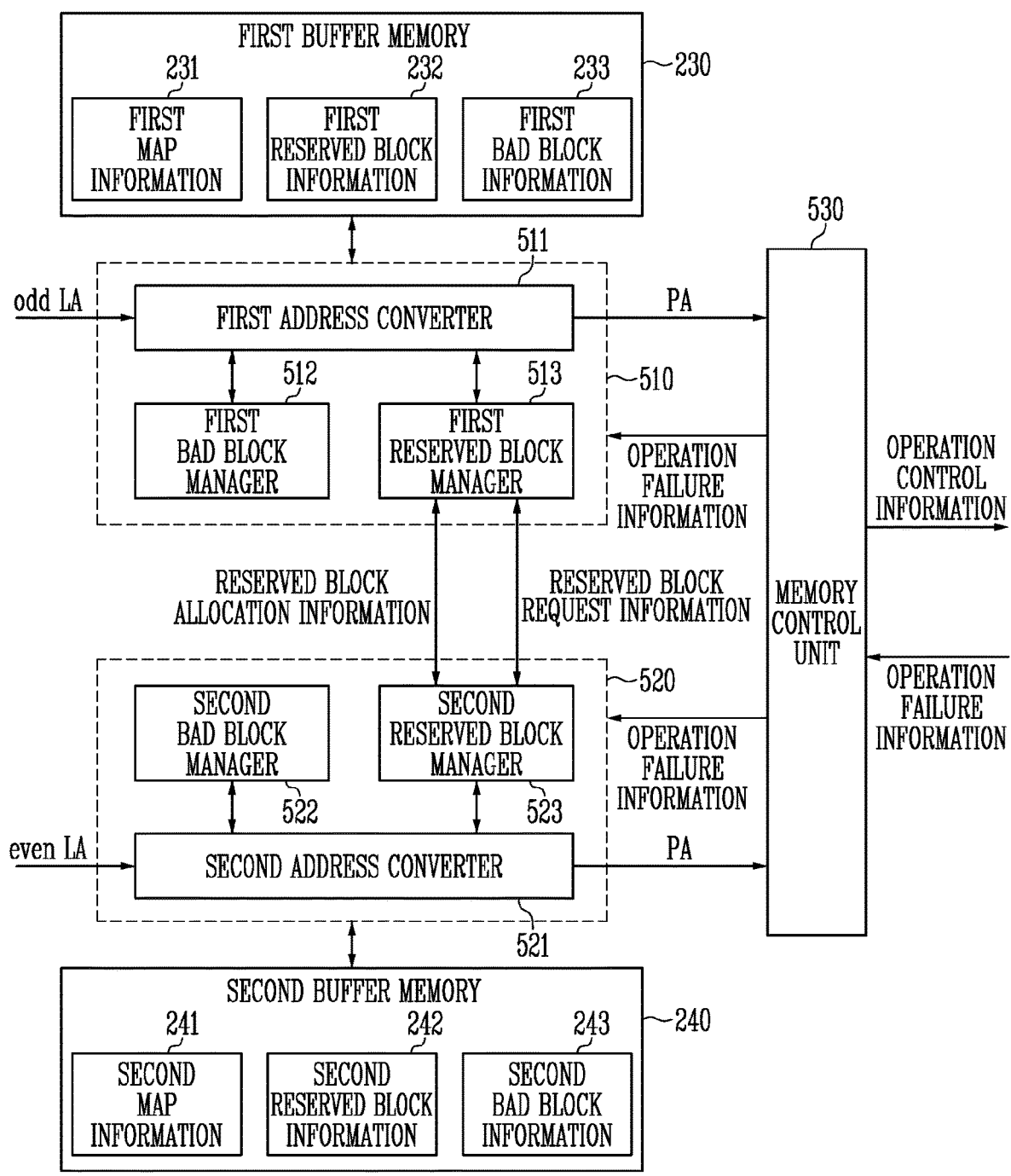
FIG. 5 is a diagram illustrating a memory controller according to an embodiment of the present disclosure.

FIG. 5 is a diagram illustrating the memory controller 200 according to an embodiment of the present disclosure.

Referring to FIG. 5, the memory controller 200 may include the first FTL 510, the second FTL 520, the first buffer memory 230, the second buffer memory 240 and a memory control unit 530.

The first FTL 510 may be firmware driven by the first processor 210 described with reference to FIGS. 2 to 4. The second FTL 520 may be firmware driven by the second processor 220 described with reference to FIGS. 2 to 4. The memory control unit 530 may be firmware driven by the memory interface 260, the first processor 210 and the second processor 220 described above with reference to FIGS. 2 to 4. The first buffer memory 230 may include first map information 231, first reserved block information 232 and first bad block information 233. The second buffer memory 240 may include second map information 241, second reserved block information 242 and second bad block information 243.

The first map information 231 may include correspondence information between an odd logical address (odd LA) received from the host 300 and a physical address of a storage area included in the memory device 100. The second map information 241 may include correspondence information between an even logical address (even LA) received from the host 300 and the physical address of the storage area included in the memory device 100.

The first reserved block information 232 may include information about a reserved block which may be replaced with a bad block occurring in the first memory area 110. The first reserved block information 232 may include information about the reserved block included in the first memory area 110 or information about the reserved block included in the second memory area 120 transferred by the second FTL 520. The second reserved block information 242 may include information about a reserved block which may be replaced with a bad block occurring in the second memory area 120. The second reserved block information 242 may include information about the reserved block included in the second memory area 120 or information about the reserved block included in the first memory area 110 transferred by the first FTL 510.

The first bad block information 233 may include information about the bad block occurring in the first memory area 110. The second bad block information 243 may include information about the bad block occurring in the second memory area 120.

The first FTL 510 may receive the odd logical address from the host 300 and convert the odd logical address into a physical address with reference to the first map information 231. The second FTL 520 may receive the even logical address from the host 300 and convert the even logical address into a physical address with reference to the second map information 241. However, the invention is not limited thereto. The first FTL 510 and the second FTL 520 may receive different types of logical addresses according to a rule or determination that may be set in advance.

The memory control unit 530 may receive the physical address from the first FTL 510 or the second FTL 520 and generate operation control information corresponding thereto. The operation control information may include a command, data, or a physical address. The memory control unit 530 may provide the operation control information to the first memory area 110 or the second memory area 120, and may receive operation failure information. The operation failure information may include information indicating that an operation corresponding to the operation control information, for example, a program operation, a read operation, or an erase operation has failed. When the operation corresponding to the operation control information is a program operation or an erase operation, the memory control unit 530 may transfer a status read command to the memory device 100 and receive the operation failure information from the memory device 100. When the operation corresponding to the operation control information is, for example, a read operation, the operation failure information may be generated after an error correction check operation is completed.

The memory control unit 530 may transfer the operation failure information to the first FTL 510 or the second FTL 520 according to whether the physical address is transferred from the first FTL 510 or the second FTL 520.

The following description is provided in the context that the memory control unit 530 transfers the operation failure information to the first FTL 510. Replacement of a bad block by the first FTL 510 in response to the operation failure information will be described below. However, the invention is not limited thereto. The memory control unit 530 may transfer the operation failure information to the second FTL 520 and the second FTL 520 may replace the bad block by the same method as the first FTL 510.

The first FTL 510 may include a first address converter 511, a first bad block manager 512 and a first reserved block manager 513.

The first address converter 511 may receive the odd logical address from the host 300 and convert the odd logical address into a physical address with reference to the first map information 231 stored in the first buffer memory 230. The first address converter 511 may transfer the converted physical address to the memory control unit 530.

When the first FTL 510 receives the operation failure information from the memory control unit 530, the first address converter 511 may change the physical address corresponding to the odd logical address. More specifically, the first address converter 511 may change a physical address of the bad block corresponding to a memory block on which an operation has failed into a physical address of a reserved block. The first address converter 511 may obtain information about the reserved block to be replaced with the bad block with reference to the first reserved block information 232.

The first bad block manager 512 may include the physical address of the bad block in the first bad block information 233.

The first reserved block manager 513 may count reserved blocks included in the first reserved block information 232. The first reserved block manager 513 may compare the number of reserved blocks with a reference number with reference to the first reserved block information 232. The first reserved block manager 513 may maintain the current status of the first reserved block information 232 when the number of reserved blocks included in the first reserved block information 232 is greater than the reference number.

The first reserved block manager 513 may add a new reserved block to the first reserved block information 232 when the number of reserved blocks included in the first reserved block information 232 is less than or equal to the reference number. More specifically, reserved block request information may be transferred to the second reserved block manager 523. The reserved block request information may be for requesting a physical address of a reserved block included in the second reserved block information 242.

The second reserved block manager 523 may receive the reserved block request information from the first reserved block manager 513 and transfer reserved block allocation information to the first reserved block manager 513. The second reserved block manager 523 may compare the number of reserved blocks included in the second reserved block information 242 with the reference number and may generate reserved block allocation information based on a comparison result. The reserved block allocation information may be about a reserved block included in the second reserved block information 242. The reserved block allocation information may include information as to whether or not allocation of reserved blocks is available.

When the number of reserved blocks included in the second reserved block information 242 is greater than a reference number, the second reserved block manager 523 may transfer information about a reserved block included in the second reserved block information 242 to the first reserved block manager 513. The first reserved block manager 513 may add the transfer information about the reserved block to the first reserved block information 232. The first address converter 511 may change the physical address of the reserved block added to the first reserved block information 232 and the physical address of the bad block. In other words, the first address converter 511 may update the first map information 231 so that a logical address corresponding to the physical address of the bad block may correspond to the physical address of the reserved block transferred by the first reserved block manager 513.

When the number of reserved blocks included in the second reserved block information 242 is less than or equal to the reference number, the second reserved block manager 523 may transfer information indicating that there is no allocable reserved block to the first reserved block manager 513. The first address converter 511 may change the physical address of the reserved block and the physical address of the bad block which are previously included in the first reserved block information 232. In other words, the first address converter 511 may update the first map information 231 so that a logical address corresponding to the physical address of the bad block may correspond to the physical address of the reserved block previously included in the first reserved block information 232.

The memory control unit 530 may copy data stored in the bad block into the reserved block having replaced the bad block. For example, when an operation corresponding to the operation control information is a read operation, the memory control unit 530 may copy data stored in pages, except for the page including data, to read into the reserved block.

The memory control unit 530 may copy data to be stored in the bad block to the reserved block replacing the bad block. For example, when the operation corresponding to the operation control information is a program operation, the memory control unit 530 may program a reserved block with data.

Similarly to the first FTL 510, the second FTL 520 may include a second address converter 521, a second bad block manager 522 and a second reserved block manager 523. The second address converter 521, the second bad block manager 522, and the second reserved block manager 523 may correspond to the first address converter 511, the first bad block manager 512, and the first reserved block manager 513, respectively. The second buffer memory 240 may include second map information 241, second reserved block information 242 and second bad block information 243. The second map information 241, the second reserved block information 242, and the second bad block information 243 may correspond to the first map information 231, the first reserved block information 232, and the first bad block information 233, respectively.

The memory blocks included in the first memory area 110 and the second memory area 120 may be managed in units of set super memory blocks. A super memory block may be a group of memory blocks. The memory blocks included in the super memory block may be normal blocks. The plurality of memory blocks included in the super memory block may be included in different memory dies. For example, memory blocks included in first to third memory dies may form a super memory block.

When a bad block occurs in the plurality of memory blocks included in the super memory block, the first reserved block manager 513 may request the second reserved block manager 523 for a reserved block to replace the bad block. Alternatively, the first reserved block manager 513 may request the second reserved block manager 523 for a reserved block to replace the normal blocks included in the super memory block as well as the bad block.

The second reserved block manager 523 may allocate the memory blocks constituting the super memory block to the first reserved block manager 513 with reference to the second reserved block information 242.

The first reserved block manager 513 may update the first map information 231 so that the allocated super memory block may be replaced with the super memory block including the bad block.

The normal blocks included in the super memory block including the bad block may be added to the first reserved block information 232 and may serve a reserved block for replacement of a bad block when the bad block occurs later. According to the present disclosure, when the number of reserved blocks included in the first reserved block information 232 is less than or equal to the reference number, the bad block occurring in the first memory area 110 may be replaced with the reserved block included in the second reserved block information 242, so that the lifespan of the entire memory device 100 may be increased.

Figure 6:
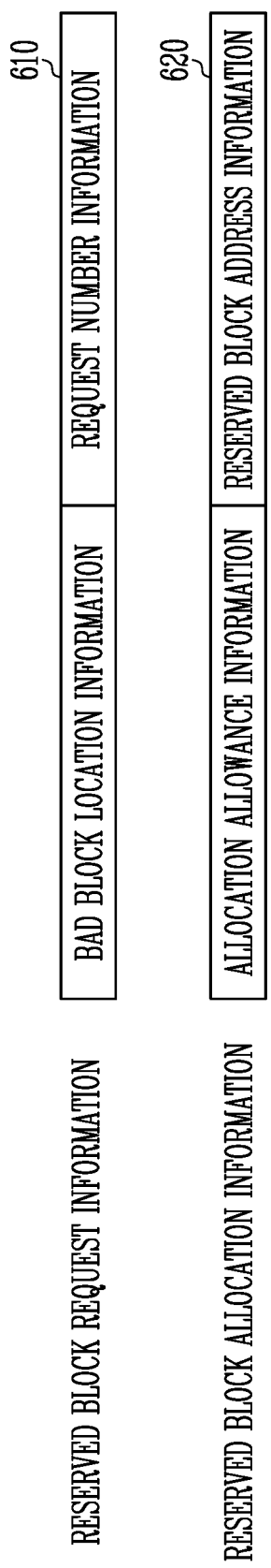
FIG. 6 is a diagram illustrating reserved block request information and reserved block allocation information.

FIG. 6 is a diagram illustrating reserved block request information and reserved block allocation information.

Referring to FIG. FIG. 6, the first reserved block manager 513 may generate reserved block request information 610. The reserved block request information 610 may include bad block location information and request number information.

The bad block location information may include physical address information of a memory block on which an operation has failed. The bad block location information may include information about a memory device, a memory die or a plane which includes a bad block.

The request number information may include information about the number of reserved blocks necessary for replacing a bad block. Therefore, the request number information may be the same as the number of bad blocks. The request number information may be generated based on the number of memory blocks expected to be bad blocks. For example, the request number information may be generated based on the number of memory blocks having an erase count, a read count or a program count which is greater than a set value. Therefore, the request number information may be greater than the number of current bad blocks.

The second reserved block manager 523 may generate reserved block allocation information 620. The reserved block allocation information 620 may include allocation allowance information and reserved block address information.

The allocation allowance information may include information as to whether allocation of a reserved block is available. When the number of reserved blocks included in the second memory area 120 or the second reserved block information 242 is greater than a reference number, the allocation allowance information may include allocation possibility information indicating that it is possible to allocate a reserved block. For example, the allocation possibility information may be indicated by a "1" bit. When the number of reserved blocks included in a memory device or reserved block information is less than or equal to the reference number, the allocation allowance information may include allocation impossibility information indicating that it is impossible to allocate a reserved block. For example, the allocation impossibility information may be indicated by a "0" bit.

The reserved block address information may include information about a physical address of at least one reserved block included in the second memory area 120 or the second reserved block information 242. The reserved block address information may include information about a memory device, a memory die or a plane which includes a reserved block.

The second reserved block manager 523 may manage a physical address of a bad block to be replaced with the reserved block allocated to the first reserved block manager 513 on the basis of the bad block location information received from the first reserved block manager 513. After a reserved block that is originally for the second memory area 120 is currently allocated for the first memory area 110, information of reserved blocks may be updated within each of the first reserved block information 232 and the second reserved block information 242.

Further, the second reserved block manager 523 may refer to the bad block location information in order to improve interleaving performance. More specifically, with reference to the location of the bad block, the second reserved block manager 523 may allocate a reserved block enabling to maintain interleaving performance even after replacement with the bad block to the first reserved block manager 513.

Figure 7:
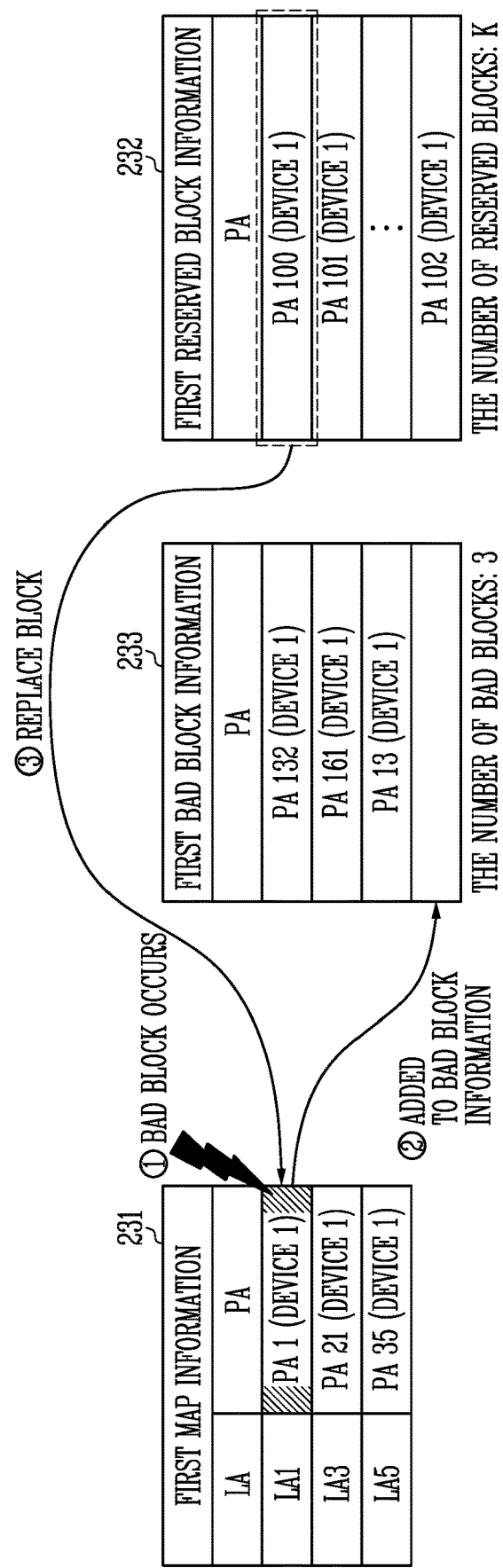
FIG. 7 is a diagram illustrating a bad block replacement process.

FIG. 7 is a diagram illustrating a bad block replacement process.

Referring to FIG. 7, the first map information 231 may include information about correspondence between a logical address (LA) 1 and a physical address (PA) 1, correspondence between LA 3 and PA 21, and correspondence between LA 5 and PA 35. PA 1, PA 21 and PA 35 may correspond to the memory blocks included in the first memory area 110.

The first bad block information 233 may include information about a memory block determined as a bad block. According to an embodiment, the first bad block information 233 may include addresses of bad blocks, i.e., PA 132, PA 161 and PA 13. The bad blocks may be memory blocks included in the first memory area 110.

The first reserved block information 232 may include information about a memory block which may be replaced with a bad block. According to an embodiment, the first reserved block information 232 may include addresses of reserved blocks, i.e., PA 100, PA 101 and PA 102. The reserved blocks may be memory blocks included in the first memory area 110.

According to an embodiment, a memory bad block corresponding to PA 1 may be determined as a bad block. The first bad manager 512 may add a memory block determined as a bad block to the first bad block information 233. The first address converter 511 may replace the bad block with the reserved block included in the first reserved block information 232. For example, the first address converter 511 may update the first map information 231 so that LA 1 corresponding to PA 1 of the bad block may correspond to PA 100 of the reserved block corresponding to an index 1 of the first reserved block information 232.

After the bad block is replaced, the first map information 231 may include information about correspondence between LA 1 and the physical address 100 PA 100, correspondence between LA 3 and PA 21, and correspondence between LA 5 and PA 35.

The first bad block information 233 may include information about a memory block determined as a bad block. According to an embodiment, the first bad block information 233 may include addresses of bad blocks, i.e., PA 132, PA 161, PA 13 and PA 1.

The first reserved block information 232 may include information about reserved blocks except for the reserved block replacing the bad block. For example, the first reserved block information 232 may include PA 101 and PA 102 but not PA 100 of the reserved block replacing the bad block.

Since the memory block corresponding to PA 100 has replaced the bad block, the number of reserved blocks included in the first reserved block information 232 may decrease from K to K−1. For convenience of explanation, it is described that the reserved blocks are decreased by 1 (one). However, the number of reserved blocks included in the first reserved block information 232 may vary depending on the number of bad blocks which have occurred. Reserved blocks corresponding to PA 62 and PA 99 may be included in the second memory area 120.

Figure 8:
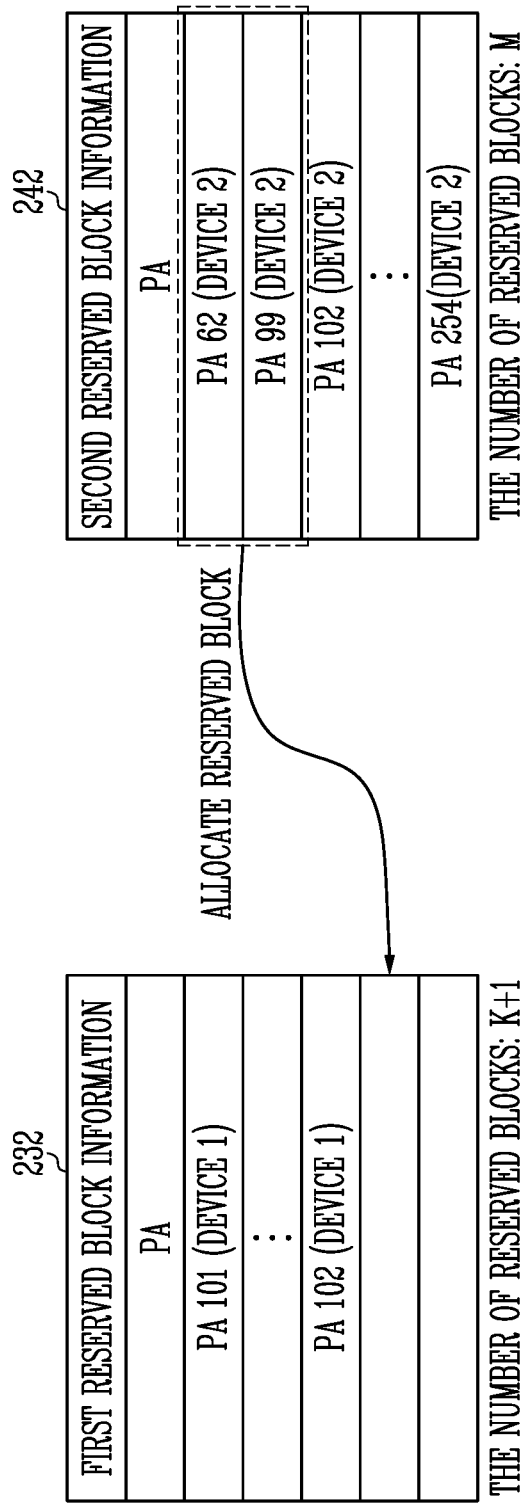
FIG. 8 is a diagram illustrating a reserved block allocation process.

FIG. 8 is a diagram illustrating a reserved block allocation process.

Referring to FIG. 8, the number (K−1) of reserved blocks included in the first reserved block information 232 may be less than or equal to a reference number. When a bad block occurs in the first memory area 110, the first reserved block manager 513 may request the second reserved block manager 523 for use of a reserved block. The second reserved block manager 523 may count the reserved blocks included in the second reserved block information 242. The second reserved block manager 523 may allocate a reserved block to the first reserved block manager 513 when the number (M) of reserved blocks included in the second reserved block information 242 is greater than the reference number. For example, the second reserved block manager 523 may allocate reserved blocks corresponding to PA 62 and PA 99 to the first reserved block manager 513. Although FIG. 8 describes that two reserved blocks are allocated, the number of reserved blocks allocated may vary in response to a request of the first reserved block manager 513. The first address converter 511 may replace the bad block occurring in the first memory area 110 with the reserved block allocated to the first reserved block information 232.

Figure 9:
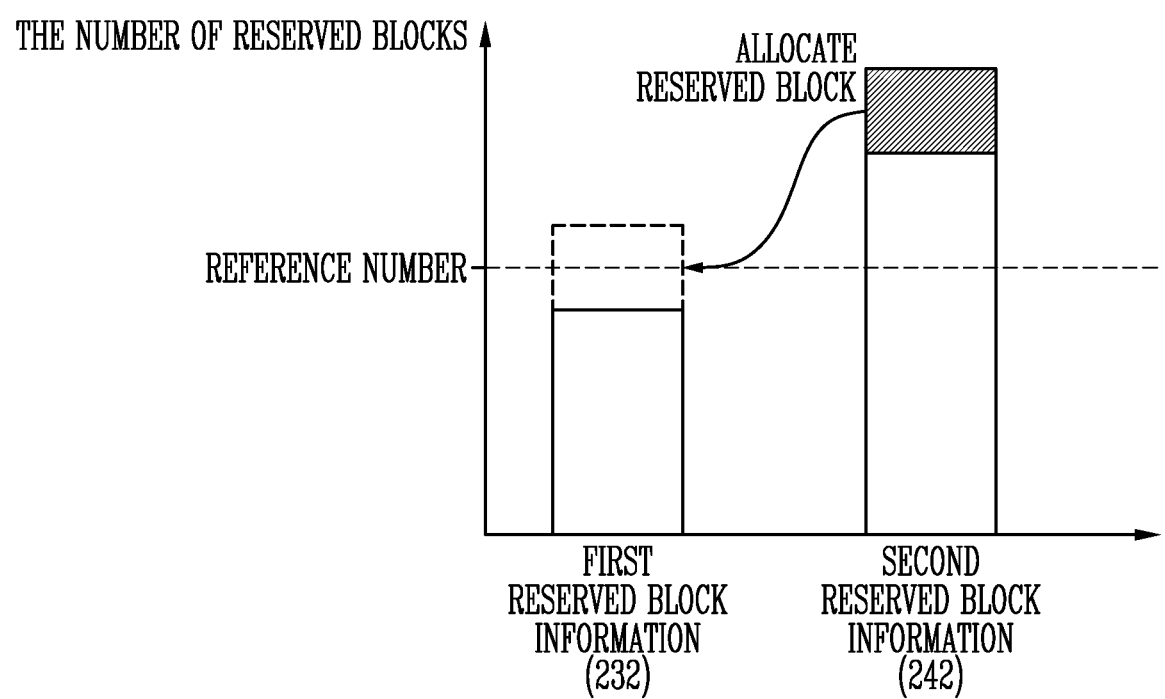
FIG. 9 is a diagram illustrating a reserved block allocation method according to an embodiment of the present disclosure.

FIG. 9 is a diagram illustrating a reserved block allocation method according to an embodiment of the present disclosure.

Referring to FIG. 9, the first reserved block manager 513 may be allocated with a reserved block from the second reserved block manager 523 when the number of reserved blocks included in the first reserved block information 232 is less than or equal to a reference number. The second reserved block manager 523 may allocate a reserved block included in the second reserved block information 242 to the first reserved block manager 513. The reserved block included in the first reserved block information 232 may be included in the first memory area 110. The reserved block included in the second reserved block information 242 may be included in the second memory area 120.

The first reserved block manager 513 may be allocated with a reserved block included in the second reserved block information 242 and may add the reserved block to the first reserved block information 232. When the reserved block is allocated to the first reserved block information, the number of reserved blocks included in the first reserved block information 232 may be greater than the reference number.

According to an embodiment, the first FTL 510 and the second FTL 520 may share the reserved blocks included in the first reserved block information 232 and the second reserved block information 242, so that the lifespan of the entire memory device 100 may be extended.

Figure 10:
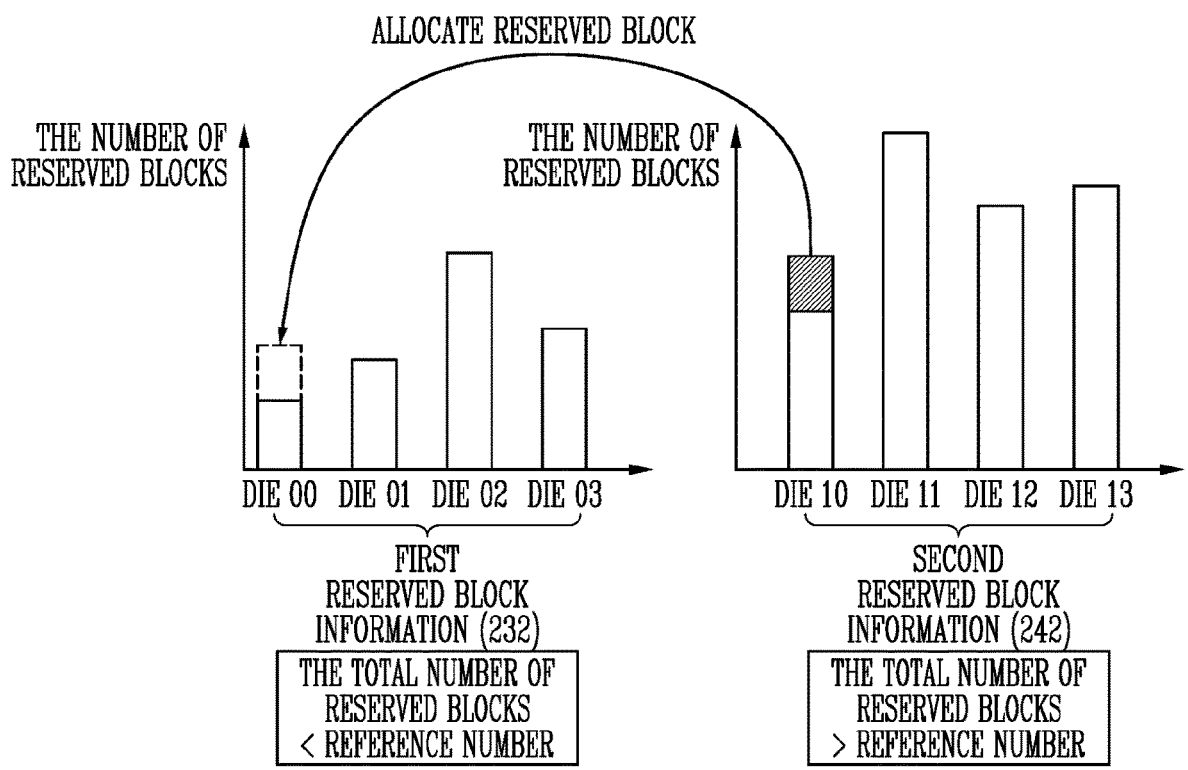
FIG. 10 is a diagram illustrating a reserved block allocation method in consideration of interleaving performance.

FIG. 10 is a diagram illustrating a reserved block allocation method in consideration of interleaving performance.

According to an embodiment, a reserved block allocation method may be used when a memory die included in the first memory area 110 and a memory die included in the second memory area 120 are coupled through a common bus. For example, according to an embodiment, a reserved block allocation method may be used when a plurality of memory dies are coupled to channels and ways.

Referring to FIG. 10, the first reserved block information 232 and the second reserved block information 242 may include information about the number of reserved blocks allocated to each of a plurality of memory dies DIE 00 to DIE 13. A memory die 00 (DIE 00), a memory die 01 (DIE 01), a memory die 02 (DIE 02) and a memory die 03 (DIE 03) may be coupled to a memory die 10 (DIE 10), a memory die 11 (DIE 11), a memory die 12 (DIE 12) and a memory die 13 (DIE 13), respectively, through the same bus, i.e., the same way.

The first reserved block manager 513 may compare the total number of reserved blocks included in the first reserved block information 232 with a reference number. When the total number of reserved blocks is less than or equal to the reference number, the first reserved block manager 513 may request the second reserved block manager 523 for use of a reserved block.

In response to the request for use of the reserved block, the second reserved block manager 523 may compare the total number of reserved blocks included in the second reserved block information 242 with the reference number. When the total number of reserved blocks is greater than the reference number, the second reserved block manager 523 may allocate the first reserved block manager 513 a reserved block included in DIE 10 coupled commonly to one bus with DIE 00 where a bad block occurs.

Since DIE 00 and DIE 10 are coupled through the same bus, interleaving performance may be maintained even when the reserved block included in DIE 00 is replaced with the reserved block included in DIE 10.

Figure 11:
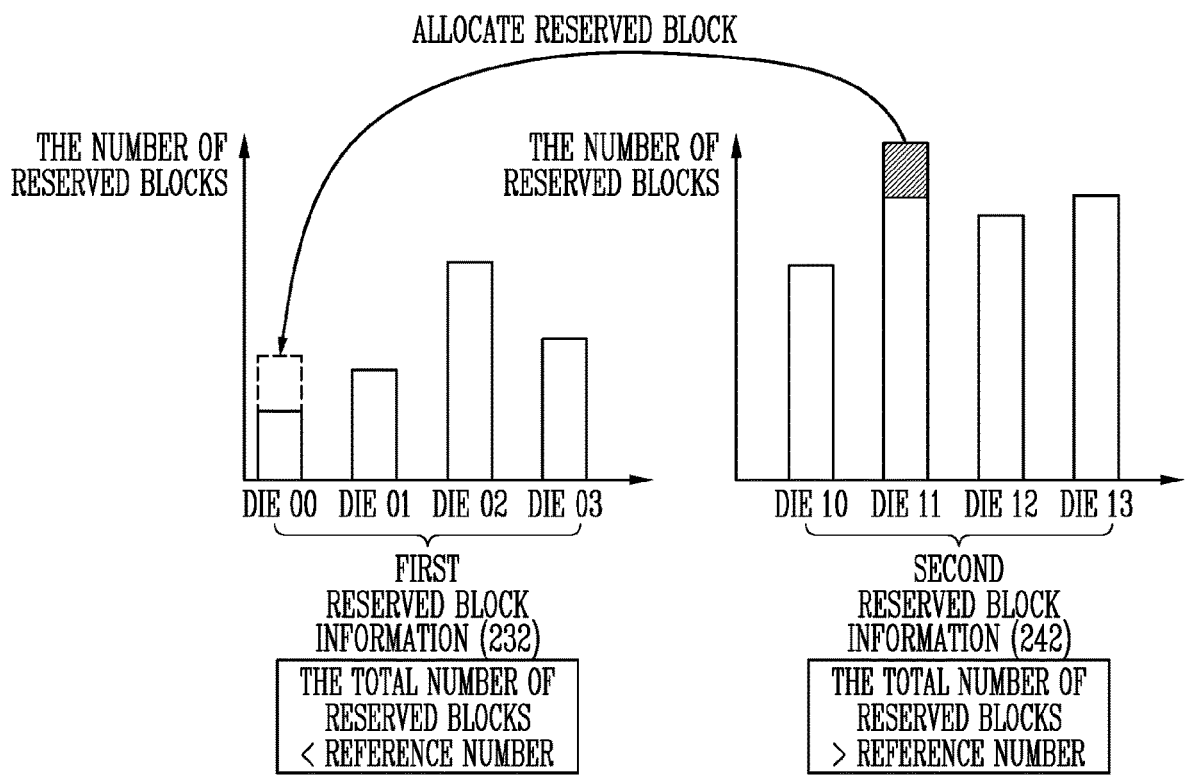
FIG. 11 is a diagram illustrating a reserved block allocation method in consideration of the number of reserved blocks included in each memory die.

FIG. 11 is a diagram illustrating a reserved block allocation method in consideration of the number of reserved blocks included in each memory die.

Referring to FIG. 11, in response to a request for the use of a reserved block, the second reserved block manager 523 may compare the total number of reserved blocks included in the second reserved block information 242 with a reference number. When the total number of reserved blocks is greater than the reference number, the second reserved block manager 523 may count reserved blocks included in each of the memory dies and allocate reserved blocks included in a memory die including the most reserved blocks to the first reserved block manager 513.

In this manner, allocation of only reserved blocks included in one memory die included in the second reserved block information to the first reserved block manager 513 may be prevented.

Figure 12:
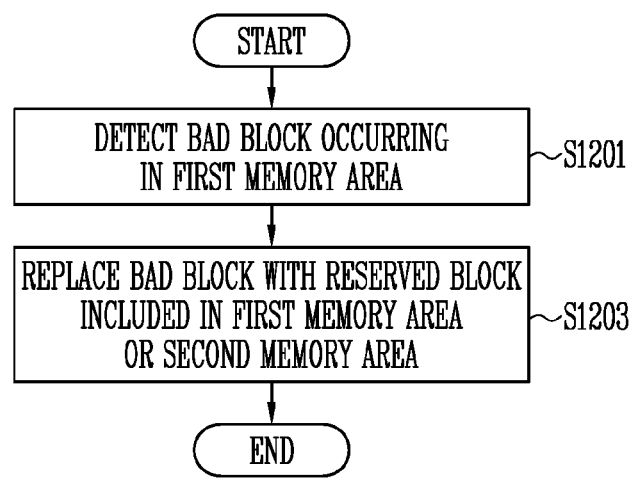
FIG. 12 is a flowchart illustrating a method of operating a memory controller according to an embodiment of the present disclosure.

FIG. 12 is a flowchart illustrating a method of operating a memory controller according to an embodiment of the present disclosure.

Referring to FIG. 12, at step S1201, the first FTL 510 may detect a bad block occurring in the first memory area 110. More specifically, the first FTL 510 may receive operation failure information from the memory control unit 530 and obtain a physical address of the bad block corresponding to a memory block on which an operation has failed.

At step S1203, the first FTL 510 may replace the bad block with a reserved block included in the first memory area 110 or in the second memory area 120 on the basis of the number of reserved blocks included in each of the first memory area 110 and the second memory area 120.

Figure 13:
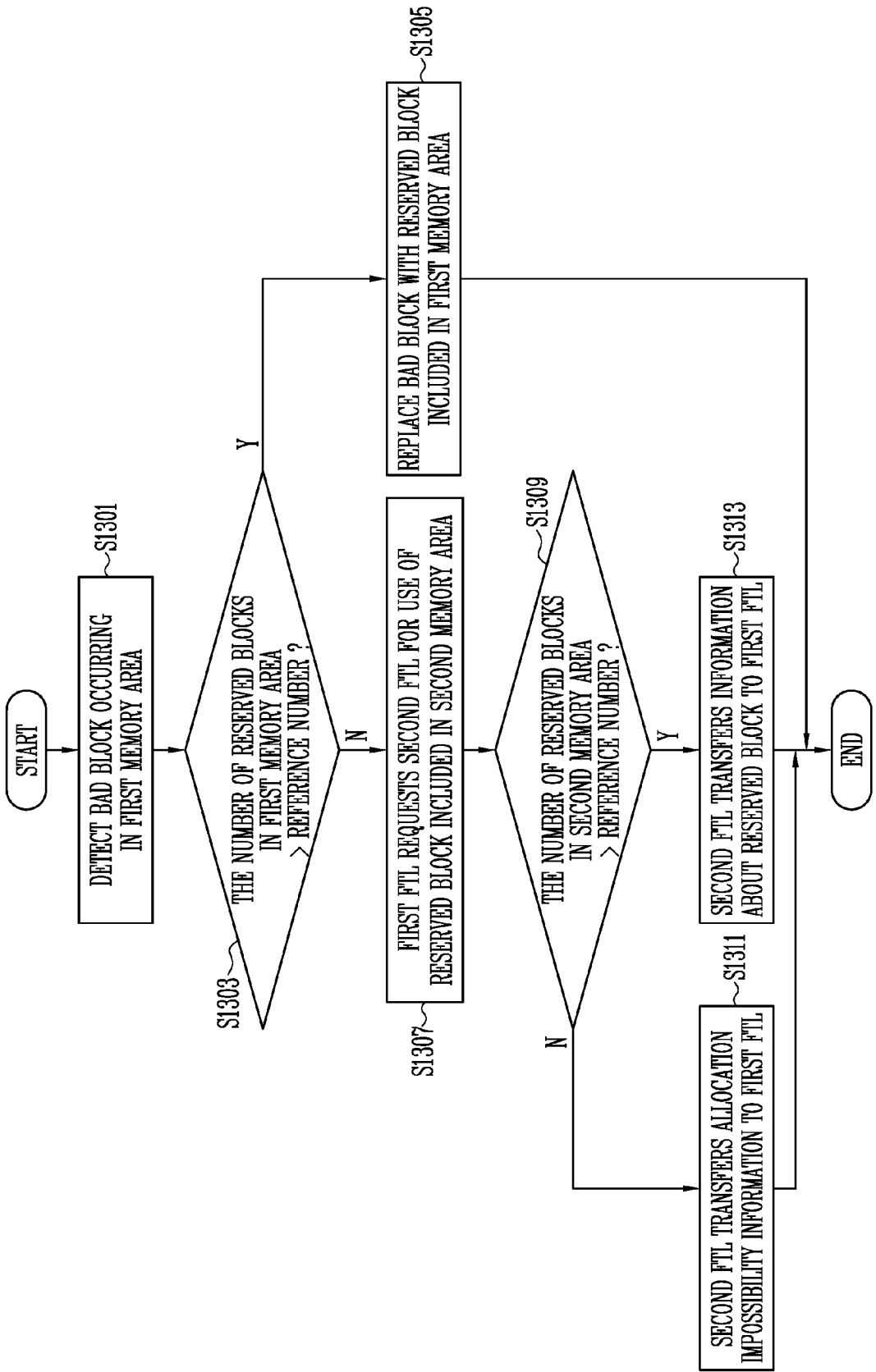
FIG. 13 is a flowchart illustrating a method of operating a memory controller according to an embodiment of the present disclosure.

FIG. 13 is a flowchart illustrating a method of operating a memory controller according to an embodiment of the present disclosure.

Referring to FIG. 13, at step S1301, the first FTL 510 may detect a bad block occurring in the first memory area 110. More specifically, the first FTL 510 may receive operation failure information from the memory control unit 530 and obtain a physical address of the bad block corresponding to a memory block on which an operation has failed.

At step S1303, the first FTL 510 may compare the number of reserved blocks included in the first memory area with a reference number. The memory controller 200 may proceed with step S1307 when the number of reserved blocks is less than or equal to the reference number, or step S1305 when the number of reserved blocks is greater than the reference number.

At step 1305, the first FTL 510 may replace the bad block with the reserved block included in the first memory area 110. The first FTL 510 may add the bad block to the first bad block information 233 and remove information about the reserved block having replaced the bad block from the first reserved block information 232. The first FTL 510 may update the first map information 231 so that a logical address corresponding to the physical address of the bad block may correspond to a physical address of the reserved block.

At step S1307, the first FTL 510 may provide the second FTL 520 with reserved block request information for requesting use of the reserved block included in the second memory area 120. The reserved block request information may be the same as described with reference to FIG. 6.

At step S1309, the second FTL 520 may compare the number of reserved blocks included in the second memory area 120 with a reference number. The memory controller 200 may proceed with step S1313 when the number of reserved blocks is greater than the reference number, or step S1311 when the number of reserved blocks is less than or equal to the reference number.

At step S1311, the second FTL 520 may transfer allocation impossibility information to the first FTL 510. The allocation impossibility information may be included in the reserved block allocation information as described above with reference to FIG. 6. For example, the allocation impossibility information may correspond to information when the allocation allowance information has a bit of "0".

At step S1313, the second FTL 520 may transfer information about reserved blocks to the first FTL 510. The second FTL 520 may transfer information about a reserved block included in a memory die coupled to a memory die including a bad block through the same channel to the first FTL 510.

Figure 14:
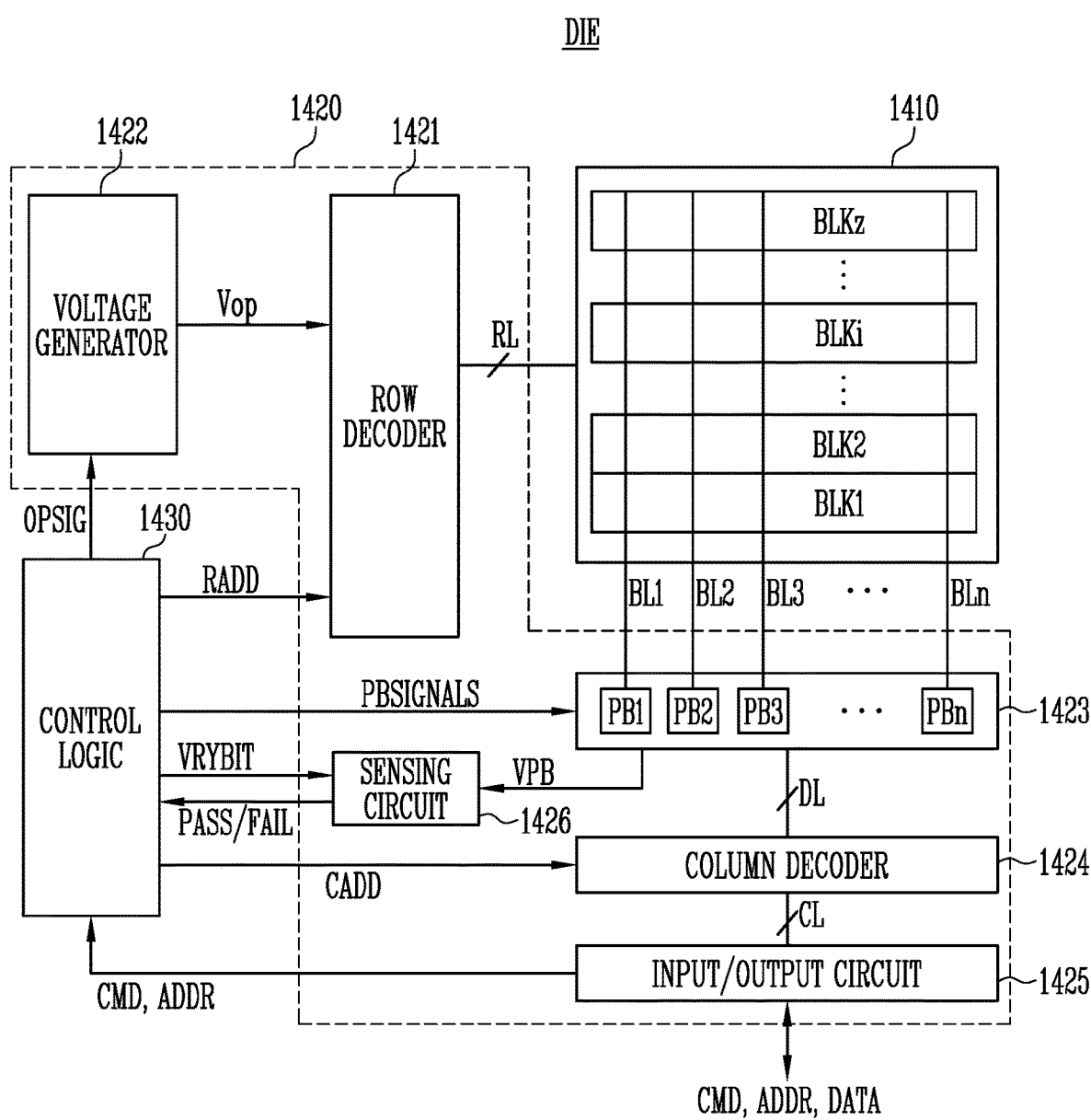
FIG. 14 is a diagram illustrating a memory die.

FIG. 14 is a diagram illustrating a memory die.

Referring to FIG. 14, a memory die may include a memory cell array 1410, a peripheral circuit 1420 and a control logic 1430.

The memory cell array 1410 may include a plurality of memory blocks BLK1 to BLKz. The plurality of memory blocks BLK1 to BLKz may be coupled to a row decoder 1421 through row lines RL. The memory blocks BLK1 to BLKz may be coupled to a page buffer group 1423 through bit lines BL1 to BLn. Each of the plurality of memory blocks BLK1 to BLKz may include a plurality of memory cells. According to an embodiment, the plurality of memory cells may be non-volatile memory cells. Memory cells coupled to the same word line may be defined as one page. Therefore, each memory block may include a plurality of pages.

The row lines RL may include at least one source select line, a plurality of word lines, and at least one drain select line.

Each of the memory cells included in the memory cell array 1410 may include a single-level cell (SLC) storing one data bit, a multi-level cell (MLC) storing two data bits, a triple-level cell (TLC) storing three data bits, or a quad-level cell (QLC) storing four data bits.

The peripheral circuit 1420 may be configured to perform a program, read or erase operation on a selected area of the memory cell array 1410 in response to control of the control logic 1430. The peripheral circuit 1420 may drive the memory cell array 1410. For example, the peripheral circuit 1420 may apply various operating voltages to the row lines RL and the bit lines BL1 to BLn or discharge the applied voltages in response to control of the control logic 1430.

The peripheral circuit 1420 may include the row decoder 1421, a voltage generator 1422, the page buffer group 1423, a column decoder 1424, and an input/output circuit 1425.

The row decoder 1421 may be coupled to the memory cell array 1410 through the row lines RL. The row lines RL may include at least one source select line, a plurality of word lines, and at least one drain select line. According to an embodiment, the word lines may include normal word lines and dummy word lines. According to an embodiment, the row lines RL may further include a pipe select line.

The row decoder 1421 may be configured to operate in response to control of the control logic 1430. The row decoder 1421 may receive a row address RADD from the control logic 1430.

The row decoder 1421 may be configured to decode the row address RADD. The row decoder 1421 may select at least one memory block among the memory blocks BLK1 to BLKz according to the decoded block address. The row decoder 1421 may select at least one word line WL of the selected memory block so as to apply voltages generated by the voltage generator 1422 to at least one word line WL according to the decoded address.

For example, during a program operation, the row decoder 1421 may apply a program voltage to the selected word line and a program pass voltage having a lower voltage level than the program voltage to unselected word lines. During a program verify operation, the row decoder 1421 may apply a verify voltage to the selected word line and a verify pass voltage greater than the verify voltage to the unselected word lines. During a read operation, the row decoder 1421 may apply a read voltage to the selected word line and a read pass voltage greater than the read voltage to the unselected word lines.

According to an embodiment, an erase operation of the memory device 100 may be performed in units of memory blocks. During an erase operation, the row decoder 1421 may select one of the memory blocks according to the decoded address. During the erase operation, the row decoder 1421 may apply a ground voltage to word lines coupled to the selected memory block.

The voltage generator 1422 may be controlled by the control logic 1430. The voltage generator 1422 may be configured to generate a plurality of voltages by using an external power voltage supplied to the memory device. More specifically, the voltage generator 1422 may generate various operating voltages Vop for program, read and erase operations in response to an operation signal OPSIG. For example, the voltage generator 1422 may generate a program voltage, a verify voltage, a pass voltage, a read voltage, and an erase voltage in response to the control of the control logic 1430.

According to an embodiment, the voltage generator 1422 may generate an internal power voltage by regulating an external power voltage. The internal power voltage generated by the voltage generator 1422 may serve as an operating voltage of the memory device 100.

According to an embodiment, the voltage generator 1422 may generate a plurality of voltages by using the external power voltage or the internal power voltage.

For example, the voltage generator 1422 may include a plurality of pumping capacitors receiving the internal power voltage and generate a plurality of voltages by selectively activating the plurality of pumping capacitors in response to the control of the control logic 1430.

The plurality of generated voltages may be supplied to the memory cell array 1410 by the row decoder 1421.

The page buffer group 1423 may include first to nth page buffers PB1 to PBn that may be coupled to the memory cell array 1410 through the first to nth bit lines BL1 to BLn, respectively. The first to nth page buffers PB1 to PBn may operate in response to the control of the control logic 1430. More specifically, the first to nth page buffers PB1 to PBn may operate in response to page buffer control signals PBSIGNALS. For example, the first to nth page buffers PB1 to PBn may temporarily store data received through the bit lines BL1 to BLn, or may sense voltages or currents in the bit lines BL1 to BLn during a read or verify operation.

More specifically, during a program operation, the first to nth page buffers PB1 to PBn may transfer data DATA received through the input/output circuit 1425 to selected memory cells through the first to nth bit lines BL1 to BLn when a program pulse is applied to a selected word line during a program operation. Memory cells of the selected page may be programmed according to the transferred data DATA. A memory cell coupled to a bit line to which a program permission voltage (e.g., a ground voltage) is applied may have an increased threshold voltage. A threshold voltage of a memory cell coupled to a bit line to which a program inhibition voltage (for example, a power voltage) is applied may be maintained. During a program verify operation, the first to nth page buffers PB1 to PBn may read page data from the selected memory cells through the first to nth bit lines BL1 to BLn, respectively.

During a read operation, the first to nth page buffers PB1 to PBn may read the data DATA from the memory cells of the selected page through the first to nth bit lines BL1 to BLn and may output the read data DATA to the data input/output circuit 1425 in response to control of the column decoder 1424.

During an erase operation, the first to nth page buffers PB1 to PBn may float the first to nth bit lines BL1 to BLn.

The column decoder 1424 may transfer data between the input/output circuit 1425 and the page buffer group 1423 in response to a column address CADD. For example, the column decoder 1424 may exchange data with the first to nth page buffers PB1 to PBn through data lines DL, or with the input/output circuit 1425 through column lines CL.

The input/output circuit 1425 may transfer the command CMD and the address ADDR from the memory controller 200 described above with reference to FIG. 1 to the control logic 1430, or may exchange the data DATA with the column decoder 1424.

A sensing circuit 1426 may generate a reference current in response to an allowable bit signal VRYBIT and compare a sensing voltage VPB received from the page buffer group 1423 with a reference voltage generated by the reference current to output a pass signal PASS or a fail signal FAIL during a read operation or a verify operation.

The control logic 1430 may control the peripheral circuits 1420 by outputting the operation signal OPSIG, the row address RADD, the page buffer control signals PBSIGNALS and the allowable bit signal VRYBIT in response to the command CMD and the address ADDR. Further, the control logic 1430 may determine whether a verify operation has passed or failed in response to the pass or fail signal PASS or FAIL.

Figure 15:
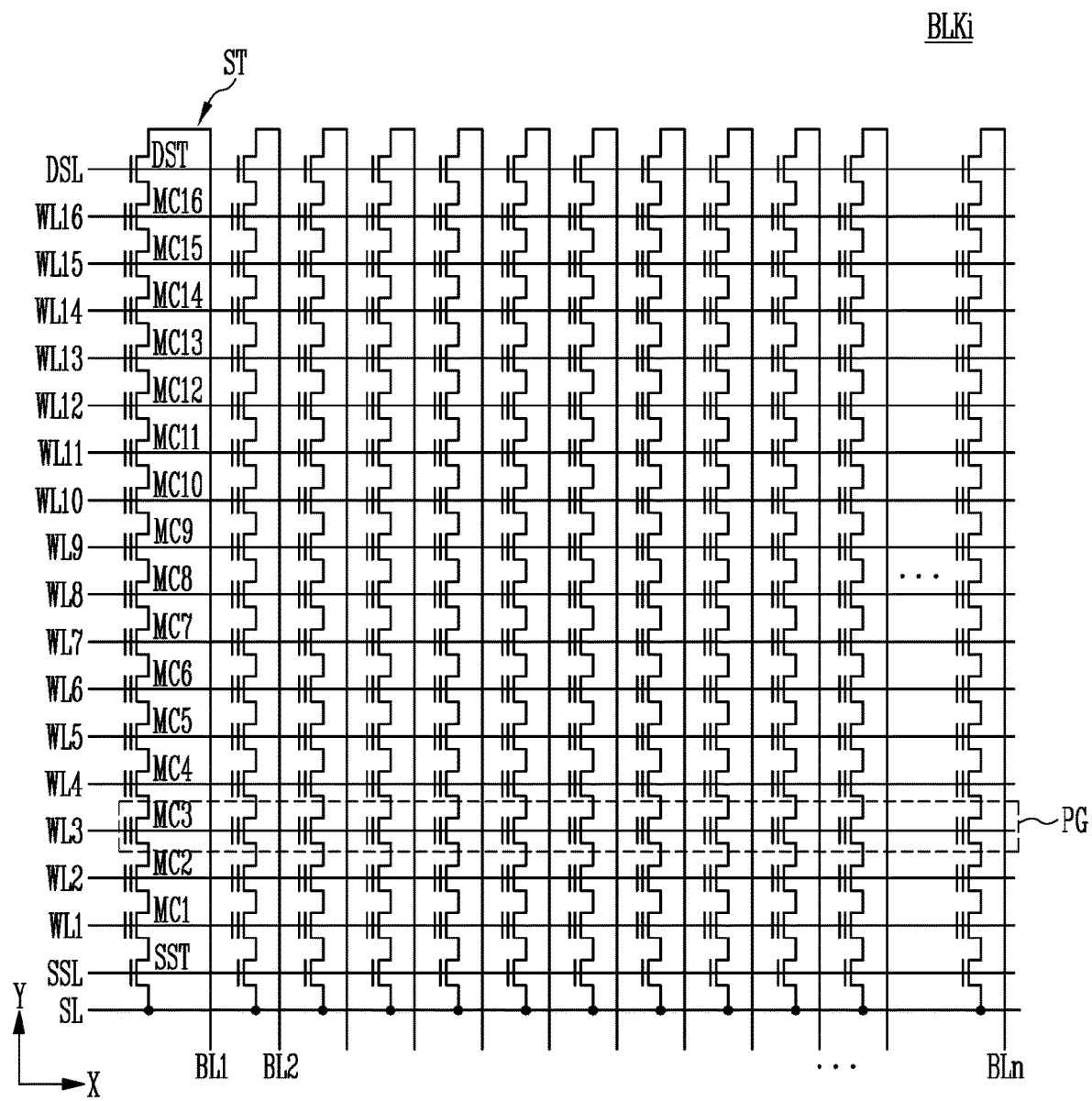
FIG. 15 is a diagram illustrating a memory block BLKi of FIG. 14.

FIG. 15 is a diagram illustrating a memory block BLKi of FIG. 14.

Referring to FIG. 15, the memory block BLKi may be configured such that a plurality of word lines arranged in parallel with each other may be coupled between a first select line and a second select line. The first select line may be a source select line SSL and the second select line may be a drain select line DSL. Specifically, the memory block BLKi may include a plurality of strings ST coupled between the bit lines BL1 to BLn and a source line SL. The bit lines BL1 to BLn may be coupled to the strings ST, respectively, and the source line SL may be coupled in common to the strings ST. Since the strings ST may have the same configuration, the string ST coupled to the first bit line BL1 will be described in detail by way of example.

The string ST may include a source select transistor SST, a plurality of memory cells MC1 to MC16, and a drain select transistor DST coupled in series between the source line SL and the first bit line BL1. Each string ST may include at least one source select transistor SST, at least one drain select transistors DST, and more memory cells than the memory cells MC1 to MC16 as shown in FIG. 15.

A source of the source select transistor SST may be coupled to the source line SL and a drain of the drain select transistor DST may be coupled to the first bit line BL1. The memory cells MC1 to MC16 may be coupled in series between the source select transistor SST and the drain select transistor DST. Gates of the source select transistors SST included in different strings ST may be coupled to the source select line SSL, gates of the drain select transistors DST may be coupled to the drain select line DSL, and gates of the memory cells MC1 to MC16 may be coupled to a plurality of word lines WL1 to WL16. A group of memory cells coupled to the same word line, among memory cells included in different strings ST, may be referred to as a physical page PG. Therefore, the memory block BLKi may include as many physical pages PG as the number of the word lines WL1 to WL16.

A single memory cell may store one bit of data. This memory cell may be generally called a single level cell (SLC). One physical page PG may store one logical page (LPG) data. One LPG data may include as many data bits as the number of cells included in one physical page PG. In addition, a single memory cell may store two or more bits of data. One physical page PG may store data corresponding to two or more logical pages LPG.

Figure 16:
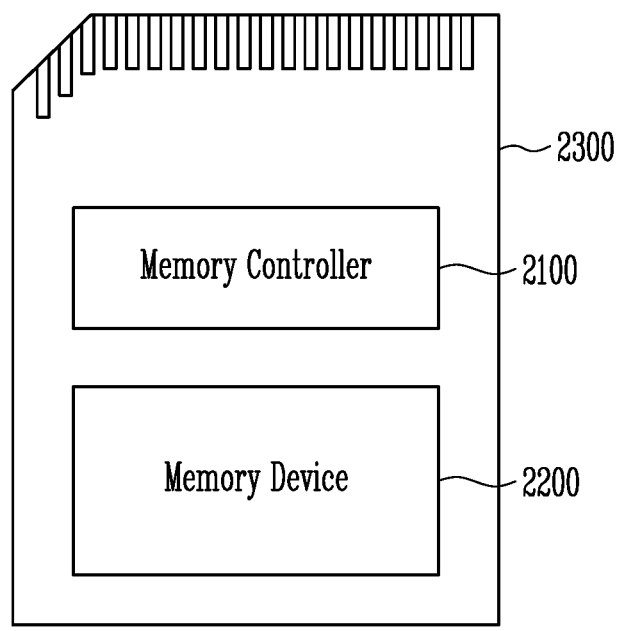
FIG. 16 is a block diagram illustrating a memory card system to which a storage device according to an embodiment is applied.

FIG. 16 is a block diagram illustrating a memory card system 2000 to which a storage device according to an embodiment is applied.

Referring to FIG. 16, the memory card system 2000 may include a memory controller 2100, a memory device 2200 and a connector 2300.

The memory controller 2100 may be coupled to the memory device 2200. The memory controller 2100 may access the memory device 2200. For example, the memory controller 2100 may be configured to control read, write, erase and background operations of the memory device 2200. The memory controller 2100 may be configured to provide an interface between the memory device 2200 and the host. The memory controller 2100 may be configured to drive firmware for controlling the memory device 2200. The memory device 2200 may have the same configuration as the memory device 100 described above with reference to FIG. 1.

In an embodiment, the memory controller 2100 may include components, such as a Random Access Memory (RAM), a processing unit, a host interface, a memory interface, and an ECC block.

The memory controller 2100 may communicate with an external device through the connector 2300. The memory controller 2100 may communicate with an external device (e.g., host) based on a specific communication protocol. For example, the memory controller 2100 may communicate with the external device through at least one of various communication protocols such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), WiFi, Bluetooth, and/or nonvolatile memory express (NVMe) protocols. For example, the connector 2300 may be defined by at least one of the above-described various communication protocols.

In an embodiment, the memory device 2200 may be implemented as any of various nonvolatile memory devices, such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and/or a Spin-Torque Magnetic RAM (STT-MRAM).

The memory controller 2100 and the memory device 2200 may be integrated into a single semiconductor device to form a memory card, such as a personal computer memory card international association (PCMCIA), a compact flash card (CF), a smart media card (SM or SMC), a memory stick, a multimedia card (MMC, RS-MMC, or MMCmicro), an SD card (SD, miniSD, microSD, or SDHC), and/or a universal flash storage (UFS).

Figure 17:
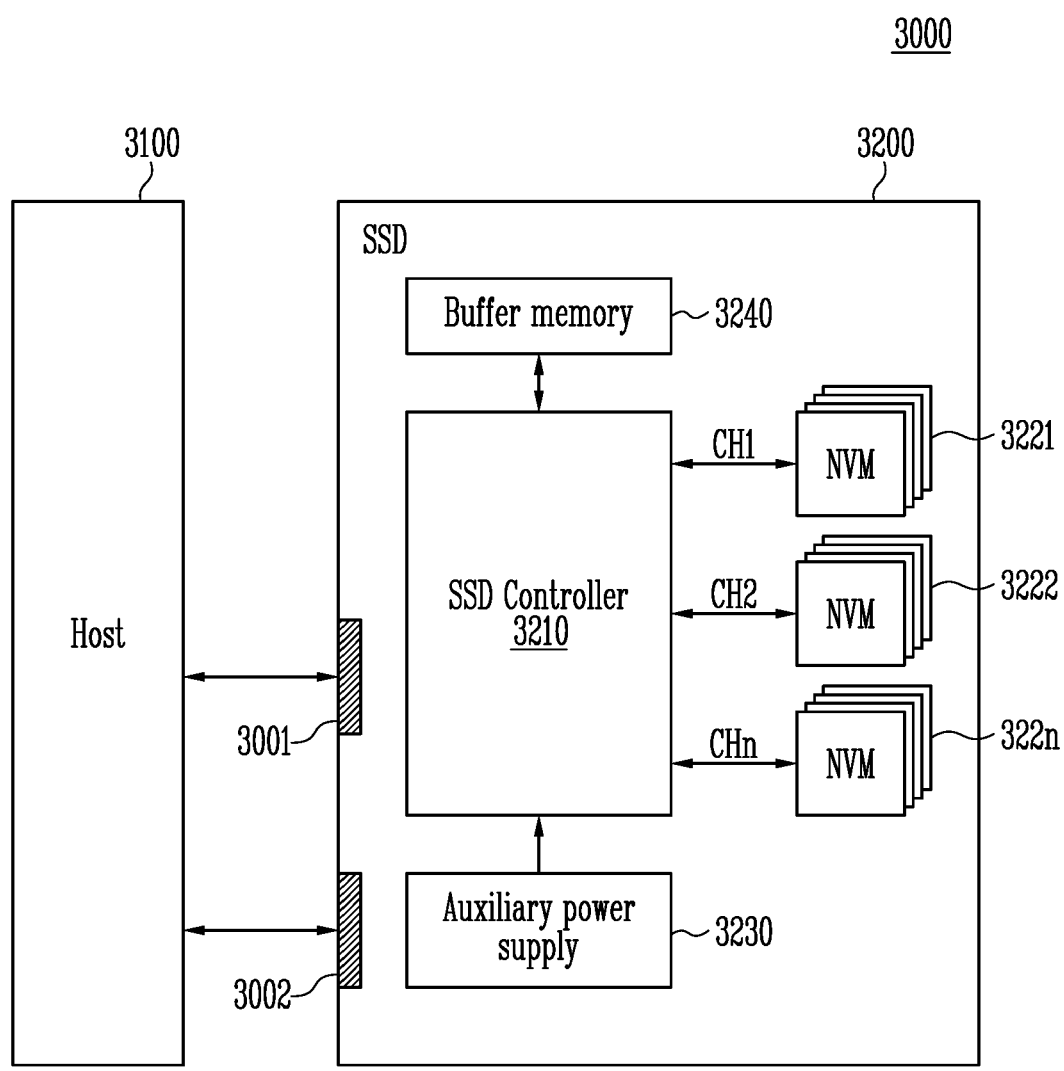
FIG. 17 is a block diagram illustrating a solid state drive (SSD) system to which a storage device according to an embodiment of the present disclosure is applied.

FIG. 17 is a block diagram illustrating a solid state drive (SSD) system 3000 to which a storage device according to an embodiment of the present disclosure is applied.

Referring FIG. 17, the SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

According to an embodiment, the SSD controller 3210 may perform the function of the memory controller 200 as described above with reference to FIG. 1.

The SSD controller 3210 may control the plurality of flash memories 3221 to 322n in response to the signals SIG received from the host 3100. According to an embodiment, the signals SIG may be signals based on the interfaces of the host 3100 and the SSD 3200. For example, the signals SIG may be defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), WiFi, Bluetooth, and/or nonvolatile memory express (NVMe) interfaces.

The auxiliary power supply 3230 may be coupled to the host 3100 through the power connector 3002. The auxiliary power supply 3230 may be supplied with the power PWR from the host 3100 and may be charged. The auxiliary power supply 3230 may supply the power of the SSD 3200 when power is not smoothly supplied from the host 3100. For example, the auxiliary power supply 3230 may be positioned inside or outside the SSD 3200. For example, the auxiliary power supply 3230 may be disposed in a main board and may supply auxiliary power to the SSD 3200.

The buffer memory 3240 may function as a buffer memory of the SSD 3200. For example, the buffer memory 3240 may temporarily store data received from the host 3100 or data received from the plurality of flash memories 3221 to 322n, or may temporarily store map data and metadata of the flash memories 3221 to 322n. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM.

Figure 18:
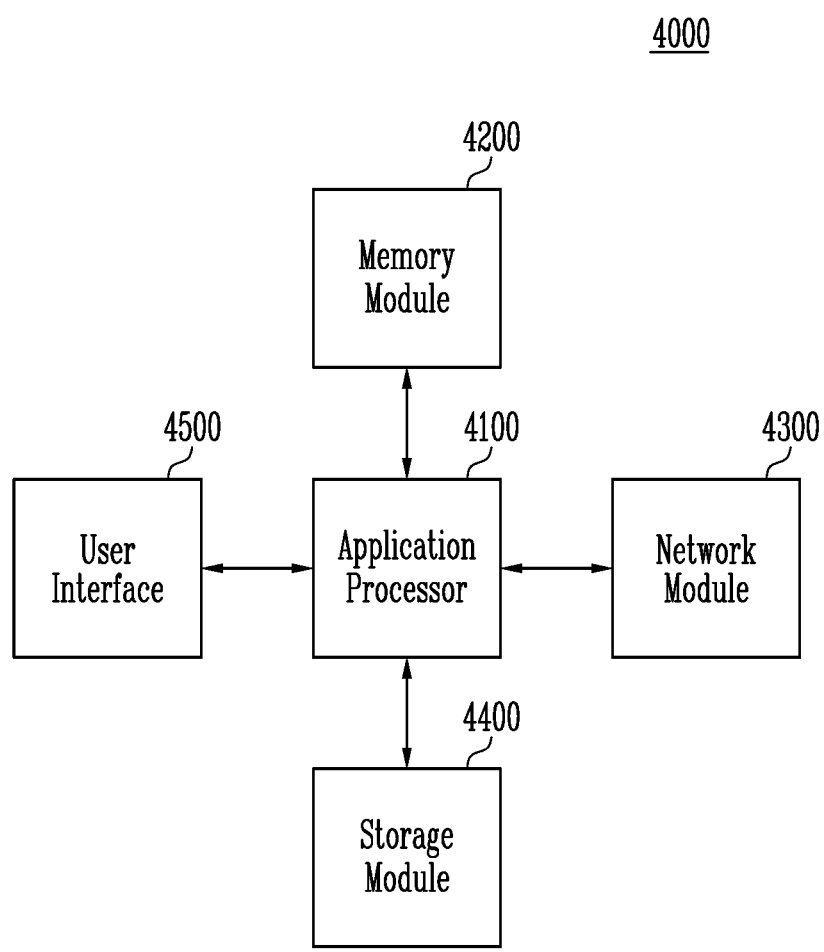
FIG. 18 is a block diagram illustrating a user system to which a storage device according to an embodiment is applied.

FIG. 18 is a block diagram illustrating a user system 4000 to which a storage device according to an embodiment is applied.

Referring to FIG. 18, the user system 4000 may include an application processor 4100, a memory module 4200, a network module 4300, a storage module 4400, and a user interface 4500.

The application processor 4100 may run components included in the user system 4000, an operating system (OS), or a user program. For example, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory or a cache memory of the user system 4000. The memory module 4200 may include volatile RAMs such as DRAM, SDRAM, DDR SDRAM, DDR2 SDRAM, DDR3 SDRAM, LPDDR SDARM, LPDDR2 SDRAM, and LPDDR3 SDRAM or nonvolatile RAMs such as PRAM, ReRAM, MRAM, and FRAM. For example, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), Wimax, WLAN, UWB, Bluetooth, or WiFi communication. For example, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. According to an embodiment, the storage module 4400 may be implemented as a nonvolatile semiconductor memory device, such as a Phase-change RAM (PRAM), a Magnetic RAM (MRAM), a Resistive RAM (RRAM), a NAND flash memory, a NOR flash memory, or a NAND flash memory having a three-dimensional (3D) structure. For example, the storage module 4400 may be provided as a removable storage medium (i.e., removable drive), such as a memory card or an external drive of the user system 4000.

According to an embodiment, the storage module 4400 may include a plurality of nonvolatile memory devices, each of which may be operated in the same manner as the memory device as described above with reference to FIG. 1. The storage module 4400 may operate in the same manner as the storage device 50 described above with reference to FIG. 1.

The user interface 4500 may include interfaces which input data or instructions to the application processor 4100 or output data to an external device. According to an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and a monitor.

According to embodiments of the present disclosure, a memory controller and an operating method thereof may provide improved reserved block management performance.

In the above-discussed embodiments, one or more steps may be selectively performed or skipped. In addition, steps may not always be performed in regular order. Furthermore, the embodiments disclosed herein aim to help those with ordinary knowledge in this art more clearly understand the present disclosure rather than aiming to limit the bounds of the present invention. In other words, one of ordinary skill in the art to which the present disclosure belongs will be able to easily understand that various modifications are possible based on the technical scope of the present disclosure. It will be apparent to those skilled in the art that various modifications can be made to the above-described embodiments of the present disclosure without departing from the spirit or scope of the invention. Thus, it is intended that the present invention cover all such modifications provided they come within the scope of the appended claims and their equivalents.

What is claimed is:

1. A memory controller controlling a first memory area including a plurality of first memory dies and a second memory area including a plurality of second memory dies, the memory controller comprising:
a first flash translation layer (FTL) configured to allocate a physical address of first memory blocks included in each of the plurality of first memory dies to a first type logical address received from a host;
a second FTL configured to allocate a physical address of second memory blocks included in each of the plurality of second memory dies to a second type logical address received from the host; and
a memory control unit configured to control the first memory area or the second memory area to perform an operation on the physical address allocated to the first type logical address or the second type logical address,
wherein the first FTL provides the second FTL with block request information for requesting use of the second memory blocks for the first type logical address,
wherein the second FTL provides the first FTL with information on a target reserved block included in a target memory die which includes a greatest number of reserved blocks among the plurality of second memory dies, and
wherein the first FTL allocates a physical address of the target reserved block to the first type logical address based on the information on the target reserved block.

2. The memory controller of claim 1, wherein the first FTL comprises:

a first reserved block manager configured to generate the block request information based on information about a bad block included in the first memory area; and
an address converter configured to determine a physical address indicating a selected memory block, among the second memory blocks, as the physical address allocated to the first type logical address based on the information on the target reserved block.

3. The memory controller of claim 1, wherein the memory control unit controls the first memory area to copy data stored in a bad block into the target reserved block.

4. The memory controller of claim 1, wherein the block request information includes bad block location information about a physical address of a bad block included in the first memory area and information about a number of second memory blocks of which the first FTL requests from the second FTL for use.

5. The memory controller of claim 4,
wherein the bad block location information comprises information about a memory die including a bad block among the plurality of first memory dies.

6. The memory controller of claim 4, wherein the information about the number of second memory blocks indicates a number of memory blocks greater than or equal to a number of bad blocks.

7. The memory controller of claim 1, wherein the second FTL provides the first FTL with block allocation information including allocation allowance information as to whether or not to allow use of the second memory blocks and the information about the target reserved block, and
wherein the information on the target reserved block includes information about the physical address of the target reserved block.

8. The memory controller of claim 7, wherein the allocation allowance information is determined based on a number of second memory blocks.

9. The memory controller of claim 7, wherein the allocation allowance information includes allocation possibility information indicating that the use of the second memory blocks is allowed when a number of second memory blocks is greater than a reference number.

10. The memory controller of claim 7, wherein the allocation allowance information includes allocation impossibility information indicating that the use of the second memory blocks is prohibited when a number of second memory blocks is less than or equal to a reference number.

11. The memory controller of claim 10, wherein the first FTL determines a physical address of the first memory blocks as the physical address allocated to the first type logical address in response to the allocation allowance information including the allocation impossibility information.

12. The memory controller of claim 7, wherein the target memory die is operable pursuant to an interleaving scheme with memory dies except for the memory die including the bad block among the plurality of first memory dies.

13. The memory controller of claim 1, wherein the first type logical address is an odd logical address and the second type logical address is an even logical address.

14. A memory controller, comprising:
a first FTL configured to process a request for a first type logical address received from a host based on information about first memory blocks included in each of a plurality of first memory dies;
a second FTL configured to process a request for a second type logical address received from the host based on information about second memory blocks included in each of a plurality of second memory dies;

a first type reserved block information storage configured to store information about first type reserved blocks to replace a bad block corresponding to the first type logical address among the first memory blocks; and a second type reserved block information storage configured to store information about second type reserved blocks to replace a bad block corresponding to the second type logical address among the second memory blocks, wherein the first FTL provides the second FTL with reserved block request information for requesting use of the second type reserved blocks based on a number of first type reserved blocks, and stores information about a target reserved block included in a target memory die which includes a greatest number of reserved blocks among the plurality of second memory dies received from the second FTL in the first type reserved block information storage, and wherein the second FTL removes the information about the target reserved block from the second type reserved block information storage, and wherein the target memory die is connected to one bus with a memory die in which a bad block occurs among the plurality of first memory dies.

15. The memory controller of claim 14, wherein the first FTL replaces the bad block with one reserved block among the first type reserved blocks when the number of first type reserved blocks exceeds a reference number.

16. The memory controller of claim 14, wherein the first FTL provides the reserved block request information to the second FTL when the number of first type reserved blocks is less than or equal to a reference number.

17. The memory controller of claim 14, wherein the information about the target reserved block includes information about a physical address of the target reserved block.

18. The memory controller of claim 17, wherein the first FTL replaces the bad block with the target reserved block.

19. A method of operating a memory controller including a first FTL managing first reserved blocks included in each of a plurality of first memory dies and a second FTL managing second reserved blocks included in each of a plurality of second memory dies, the method comprising:

detecting, by the first FTL, a bad block occurring in the plurality of first memory dies;

providing, by the first FTL, the second FTL with reserved block request information for requesting the second FTL for use of the second reserved blocks based on a number of first reserved blocks;

providing, by the second FTL, the first FTL with information on a target reserved block included in a target memory die which includes a greatest number of reserved blocks among the plurality of second memory dies;

receiving, by the first FTL, the information on the target reserved block from the second FTL; and replacing, by the first FTL, the bad block with the target reserved block by mapping a logical address corresponding to the bad block to a physical address of the target reserved block.

\* \* \* \* \*